(12) United States Patent
Suzuki

(10) Patent No.: US 7,274,093 B2
(45) Date of Patent: Sep. 25, 2007

(54) SEMICONDUCTOR DEVICE CONNECTOR, SEMICONDUCTOR DEVICE CARRIER, SEMICONDUCTOR DEVICE SOCKET USING THE SAME AND PROBE CARD

(75) Inventor: Takeyuki Suzuki, Yokohama (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 69 days.

(21) Appl. No.: 11/315,482

(22) Filed: Dec. 23, 2005

(65) Prior Publication Data

US 2006/0138641 A1 Jun. 29, 2006

(30) Foreign Application Priority Data

Dec. 24, 2004 (JP) ............................. 2004-374531
Dec. 16, 2005 (JP) ............................. 2005-363829

(51) Int. Cl.
*H01L 23/02* (2006.01)
*H01L 23/34* (2006.01)

(52) U.S. Cl. ...................... 257/678; 257/718; 257/719; 257/731; 257/733; 257/737; 257/738; 257/E23.001; 257/E23.033; 257/E23.063; 257/E23.965

(58) Field of Classification Search ........ 257/678–733, 257/737, 738, 772, 778, 718, 779, E23.021, 257/E23.069, E23.015, E23.02; 438/613–617; 228/180.22

See application file for complete search history.

(56) References Cited

U.S. PATENT DOCUMENTS

2006/0071331 A1* 4/2006 Kuroda et al. .............. 257/727

FOREIGN PATENT DOCUMENTS

| JP | 5-028037 | 4/1993 |
| JP | 2004-047186 | 2/2004 |

* cited by examiner

*Primary Examiner*—Jasmine Clark
(74) *Attorney, Agent, or Firm*—Finnegan, Henderson, Farabow, Garrett & Dunner, LLP

(57) ABSTRACT

A semiconductor device carrier comprising; a carrier housing having a housing portion for accommodating a semiconductor device; an electrode sheet disposed in the carrier housing, having a front surface wiring conductively arranged on a front surface of an insulation substrate, a rear surface wiring conductively arranged on a rear surface of the insulation substrate, a rear surface bump contact placement wiring, and a bump contact disposed in a contact placement portion and an elastic sheet disposed in the carrier housing to be in contact with the bottom of the electrode sheet; wherein a width of the rear surface bump contact placement wiring in correspondence to a bump contact to be in contact with an extreme electrode section of the semiconductor device is smaller than a width of the front surface bump contact placement wiring on which a bump contact to be in contact with the extreme electrode section is arranged.

10 Claims, 40 Drawing Sheets

COLLAPSED SHAPE OF THE TIP END OF THE BUMP CONTACT 55A

COLLAPSED SHAPE OF THE TIP END OF THE BUMP CONTACT 55B

OVERLAYING COLLAPSED SHAPE OF BUMP CONTACT 55A ON THAT OF BUMP CONTACT 55B

SEMICONDUCTOR DEVICE CONNECTOR, SEMICONDUCTOR DEVICE CARRIER, SEMICONDUCTOR DEVICE SOCKET USING THE SAME AND PROBE CARD

This application claims priority from Japanese Patent Applications Nos. 2004-374531 filed Dec. 24, 2004 and 2005-363829 filed Dec. 16, 2005, which are hereby incorporated by reference herein.

BACKGROUND OF THE INVENTION

1. Field of the Invention

The present invention relates to a semiconductor device connector, a semiconductor device carrier, a semiconductor device socket using the same and a probe card.

2. Description of the Related Art

In the prior tart, semiconductor devices such as KGD (known good die) have been tested prior to being mounted to an electronic appliance or others. As a result, the semiconductor devices having any faults have been omitted.

In such a test, the semiconductor devices are placed on a semiconductor device carrier that is then accommodated in a socket having a carrier housing portion fixed to a substrate such as a test board. Thereafter, the semiconductor devices are tested via the semiconductor device carrier and the socket.

In this regard, when tested, it is necessary to bring the semiconductor device to be tested into contact with bump contacts of an electrode sheet having provided on the semiconductor carrier, resulting in the electric contact between the both.

A contact pressure necessary for the contact between the electrode section of the semiconductor device and the bump contacts is properly determined with reference to a pressing force due to a pressing member held on the semiconductor device carrier, a pressing force due to an elastic member disposed on the bottom of the electrode sheet, and a reactive force against the pressing force due to the elastic member disposed on the bottom of the electrode sheet (see Japanese Patent Application Laid-open No. 2004-047186).

In the prior art, however, since the contact pressure necessary for the contact of the electrode section in the semiconductor device with the bump contacts is properly determined with reference to the pressing force due to pressing member held by the semiconductor device carrier and the reactive force due to the elastic sheet disposed on the bottom of the electrode sheet when the semiconductor device carrier, the bump contacts of the electrode sheet in the semiconductor device socket and the electrode section of the semiconductor device are brought into contact with each other, there may be a risk of occurring such problems as illustrated in FIGS. 34 to 40.

A first example of the prior art device will be first described below with reference to FIGS. 34 to 40.

A prior art electrode sheet 101 includes bumps 103A and 103B to be in contact with an electrode section (not shown) of the semiconductor device 107, an insulating substrate 102, and a front surface wiring 104 and a rear surface wiring 105 as a conductor routing, arranged on front and rear surfaces, respectively, of the insulation substrate 102. In the Figures, two of the bumps 103A and 103B, respectively, are shown in an exaggerated manner as a representative for convenience of the explanation.

The surface wiring 104 has bump placement sections 104A on which are disposed the bump contacts 103A and 103B.

The rear surface wiring 105 is formed to have the same shape as that of the front surface wiring 104, and has a rear surface bump placement section wiring 105A having the same shape as the bump placement sections 104A at a position corresponding thereto.

On the bottom of the rear surface wiring 105, an elastic sheet 106 is disposed for generating a reactive force necessary for the contact against the pressing force.

To bring the electrode section of the semiconductor device 107 into contact with the bump contacts 103A, 103B, a tip ends of the bump contacts 103A and 103B are pressed by the electrode section of the semiconductor device 107 as shown in FIG. 38, when the semiconductor device 107 is pressed onto the electrode sheet 101 by a pressing member (not shown) of the carrier, whereby a reactive force against the pressing force is generated by the elastic sheet 106 to bring the both into contact with each other at a suitable pressure.

However, as shown in FIGS. 37 and 38, the elastic sheet 106 is liable to deflect due to the pressing force, whereby the elastic force (reactive force) of the elastic sheet 106 applied to the bump contacts 103A and 103B becomes irregular. Thus, the bump contact 103A is brought into contact with an extreme portion of the electrode section in the semiconductor device 107 in a larger inclined state than the bump contact 103B, whereby a tip end of the bump contact 103A collapses more than that of the bump contact 103B (e.g. a diameter of the collapsed tip end of the bump contact 103A is not less than 40 μm). The reactive force of the elastic sheet 106 corresponding to the size of the collapsed tip end of the bump contact 103A is also larger than other parts (including a portion of site adjacent to the bump contact 103B about the central axis of the tip end of the bump contact 103A)

In a second example shown in FIGS. 39 and 40 wherein the number of the bump contacts is larger than that in the first example, since the elastic sheet 206 is deflected by the pressing force as illustrated, the reactive force applied to the bump contacts 203A, 203B, 203C, 203D and 203E becomes irregular, whereby the bump contact 203A is brought into contact with the extreme portion of the electrode section in the semiconductor device 207 in a more inclined state than that of the bump contacts 203D and 203E closer to a center line.

As shown in FIG. 40, areas of the collapsed tip ends of the bump contacts 203A, 203B, 203C, 203D and 203E become larger as the bump contacts are closer to the extremity of the electrode section farthest from the center line.

That is, the bump contact in contact with the extremity of the electrode section is largely damaged when it is brought into contact with the electrode section of the semiconductor device 207, whereby the collapse of the tip end of the bump contact 203A is larger than that of the bump contact 203B.

In such a manner, the degree of wear of the tip end of the bump contact is larger as it is closer to the bump contact to be in contact with the extremity of the electrode section of the semiconductor device.

For example, when the tests are repeated a plurality of times, there may be a risk in that the electric connection of the bump contact touching with the extremity of the electrode section in the semiconductor device becomes unsafety.

Also, since the degree of wear of the bump contact closer to the outer side (toward the extremity of the electrode section) is different from that of the bump contact closer to the inner side (toward the center line), it is necessary to exchange the electrode sheet for the purpose of obtaining the reliable electric connection even if the degree of wear of the bump contact closer to the inner side is small, whereby the utilization factor of the electrode sheet in the test is worsened.

SUMMARY OF THE INVENTION

By taking the above problems into account, the present invention provides a semiconductor device connector, a semiconductor device carrier capable of decreasing the variation of the degree of wear in the respective bump contact by restricting the inclination of the bump contact when the electrode section of the semiconductor device is brought into contact with the bump contacts, and a semiconductor device socket using the same and a probe card.

The semiconductor device connector in accordance with the present invention comprises an electrode sheet disposed on a surface of an insulation substrate and having a bump contact to be in contact with an electrode section of a semiconductor device and a bump contact placement wiring connected to the bump contact; a sheet member disposed beneath the electrode sheet, the sheet member being elastically deformed when pressed through the electrode sheet; and a signal input/output section electrically connected to the electrode section of the semiconductor device through the electrode sheet, wherein a width of the bump contact placement wiring corresponding a bump contact to be in contact with an extreme electrode section of the semiconductor device is smaller than a width of a bump contact placement wiring formed in association with a bump contact adjacent to the bump contact.

The inventive semiconductor device carrier comprises; a carrier housing having a housing portion for accommodating a semiconductor device; an electrode sheet disposed in the carrier housing, having a front surface wiring arranged on a front surface of an insulation substrate, a rear surface wiring arranged on a rear surface of the insulation substrate, a rear surface bump contact placement wiring formed on the rear surface wiring, and a bump contact disposed in a contact placement portion on the front surface wiring to be in contact with an electrode section of the semiconductor device; a pressing member held by the carrier housing, for pressing the semiconductor device housed therein onto the electrode sheet; and an elastic sheet disposed in the carrier housing to be in contact with the bottom of the electrode sheet; wherein a width of the rear surface bump contact placement wiring in correspondence to a bump contact to be in contact with an extreme electrode section of the semiconductor device is smaller than a width of the front surface bump contact placement wiring on which a bump contact to be in contact with the extreme electrode section is arranged.

The inventive semiconductor device socket comprises a semiconductor device carrier described above, a socket body having a carrier housing for accommodating the semiconductor device carrier, and a contact terminal disposed in the socket body to be in contact with a pad provided in the electrode sheet.

The inventive probe card comprises an electrode sheet disposed on a surface of an insulation substrate and having a plurality of groups of bump contacts constituted by a set of bump contacts to be in contact with an electrode section of a wiring pattern on a semiconductor device and a rear surface bump contact placement wiring formed on the rear surface of the insulation substrate, the rear surface bump contact placement wiring connected to the bump contacts; an anisotropic conductive sheet disposed to be in contact with the surface of the electrode sheet on which the rear surface bump contact placement wiring is formed, the sheet being put in a conductive state when pressed through the electrode sheet; and a wiring board electrically connected to the electrode section of the semiconductor device through the electrode sheet and the anisotropic conductive sheet, wherein a width of the rear surface bump contact placement wiring in correspondence to a bump contact to be in contact with an extreme electrode section of the semiconductor device is smaller than a width of a rear surface bump placement wiring formed in association with a bump contact adjacent to the bump contact.

According to the semiconductor device carrier and the semiconductor device socket using the former in accordance with the present invention, since the bump contact placement wiring in the electrode sheet is optionally shaped, the inclined contact of the bump contact with the electrode section of the semiconductor device is avoidable, whereby the electric connection of the semiconductor device with the bump contact is securable.

The above and other objects, effects, features and advantages of the present invention will become more apparent from the following description of embodiments thereof taken in conjunction with the accompanying drawings.

DESCRIPTION OF THE PREFERRED EMBODIMENTS

First Embodiment

An embodiment according to the present invention will be described below with reference to the attached drawings.

Figure 1:
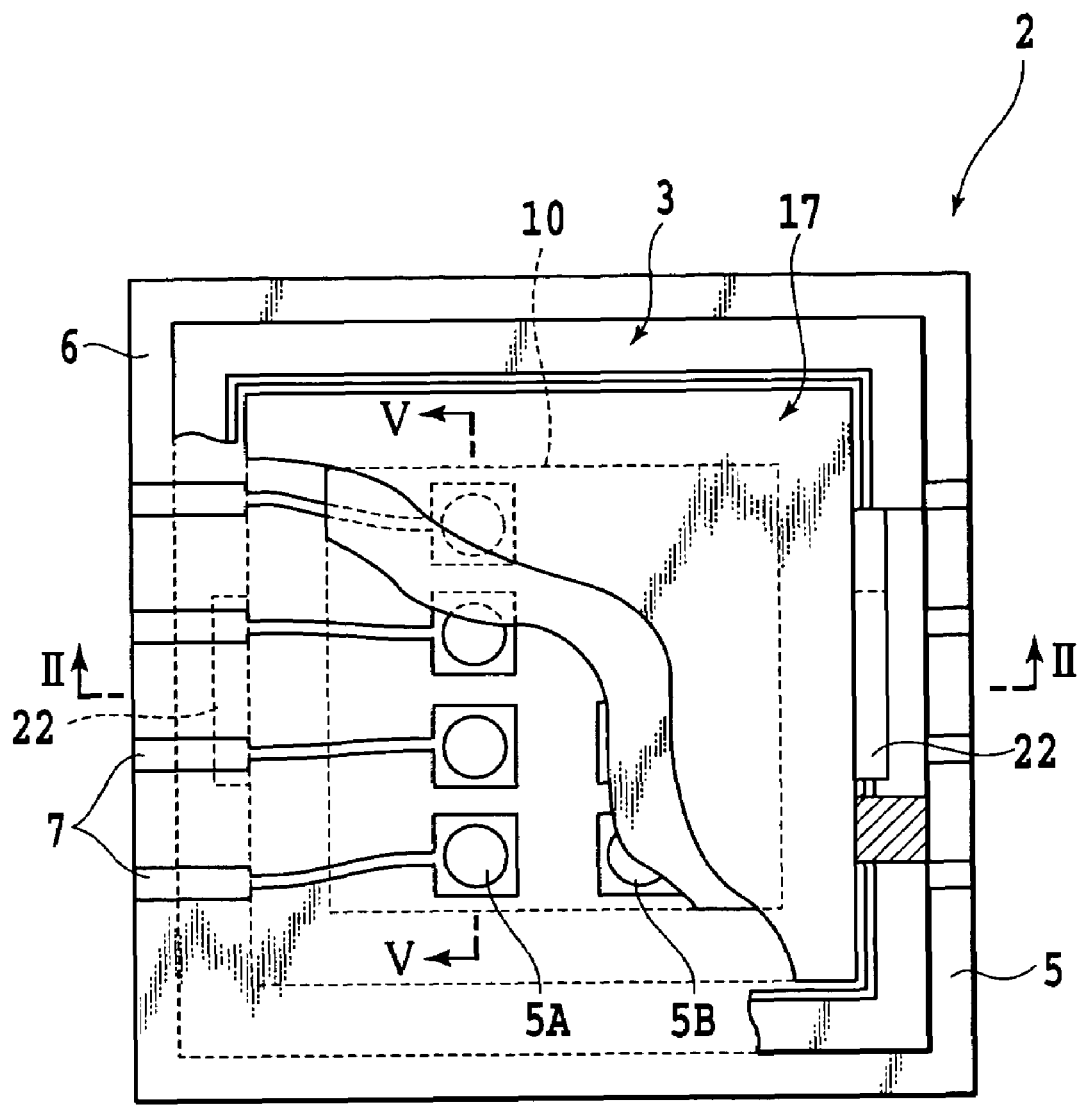
FIG. 1 is a partially plan view schematically illustrating one embodiment of a semiconductor device carrier in a semiconductor device socket according to the present invention.
Figure 2:
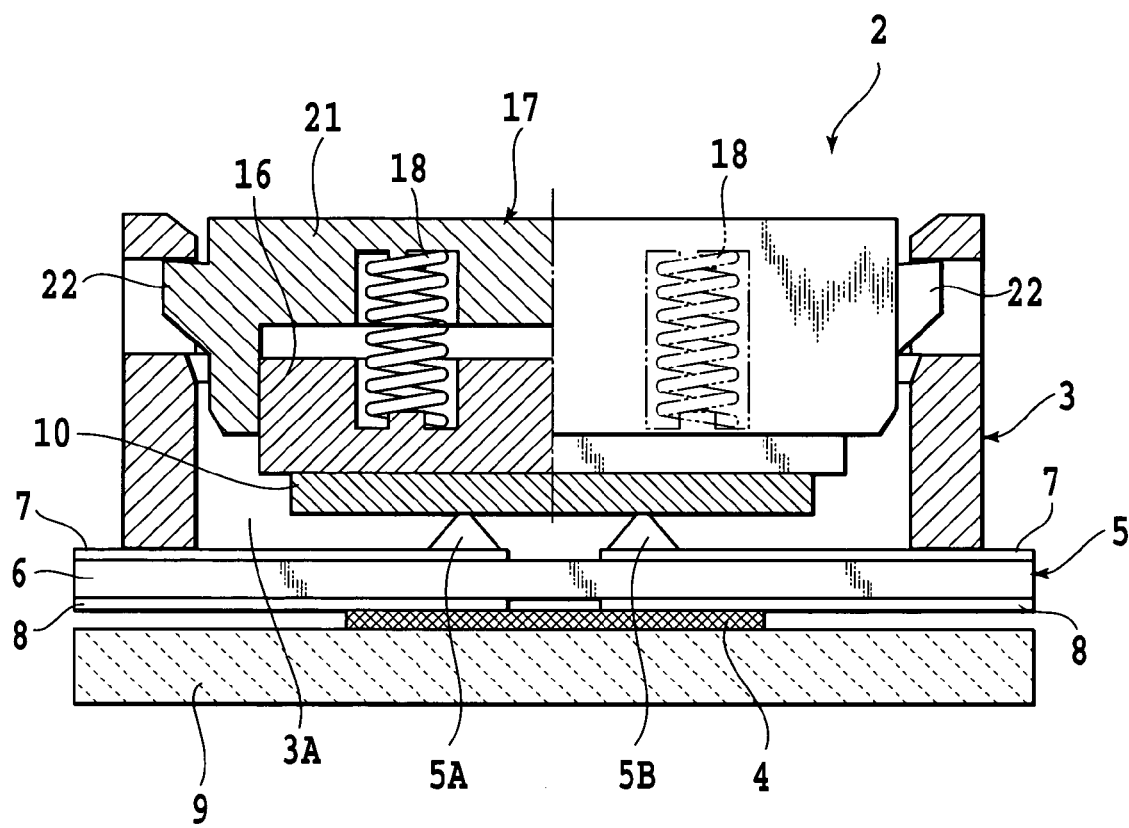
FIG. 2 is a partially sectional view of a main part of the semiconductor device carrier according to the present invention taken along a line II-II in FIG. 1.
Figure 3:
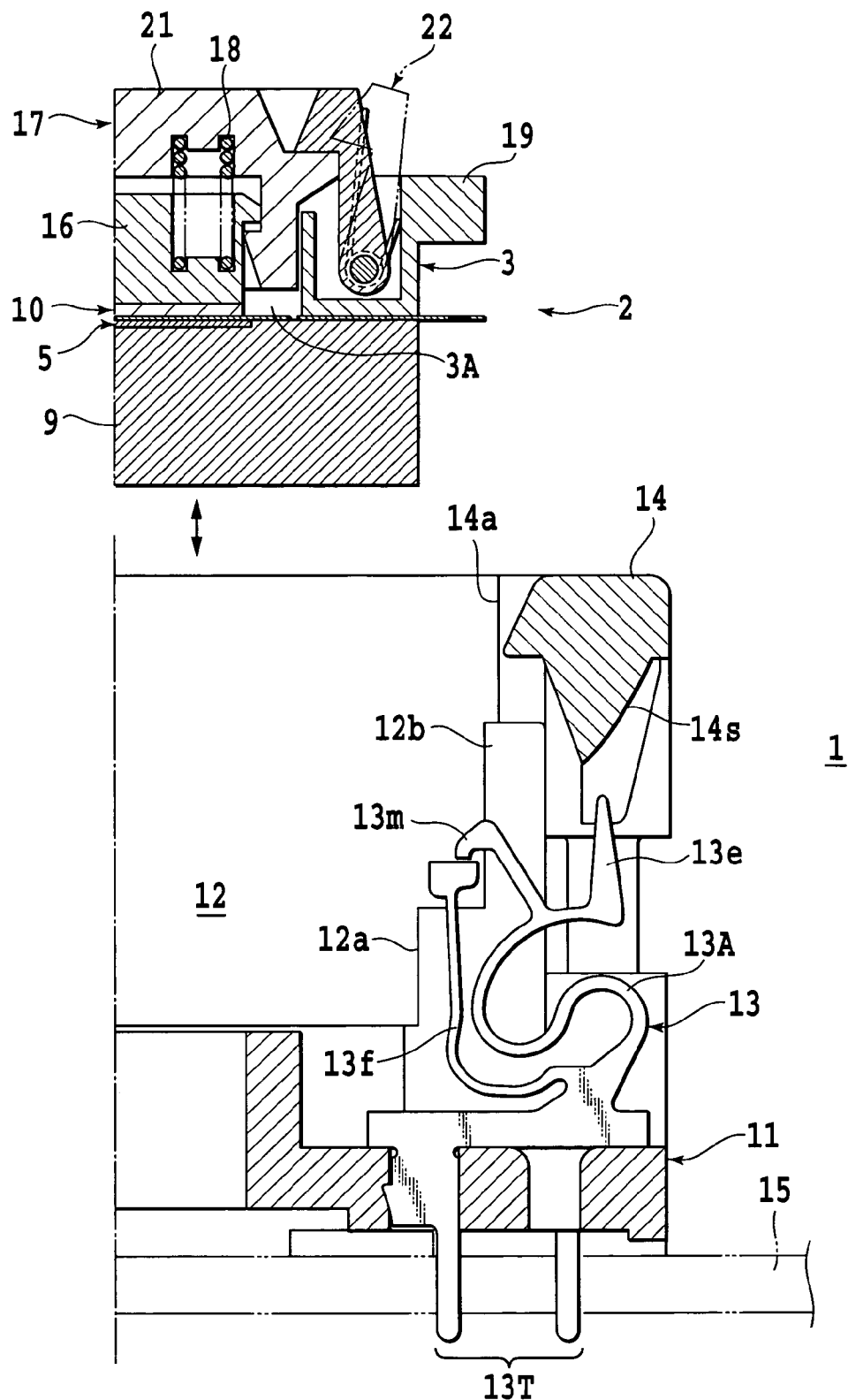
FIG. 3 is a partially sectional view schematically illustrating a total structure of the semiconductor device socket according to the present invention.
Figure 4:
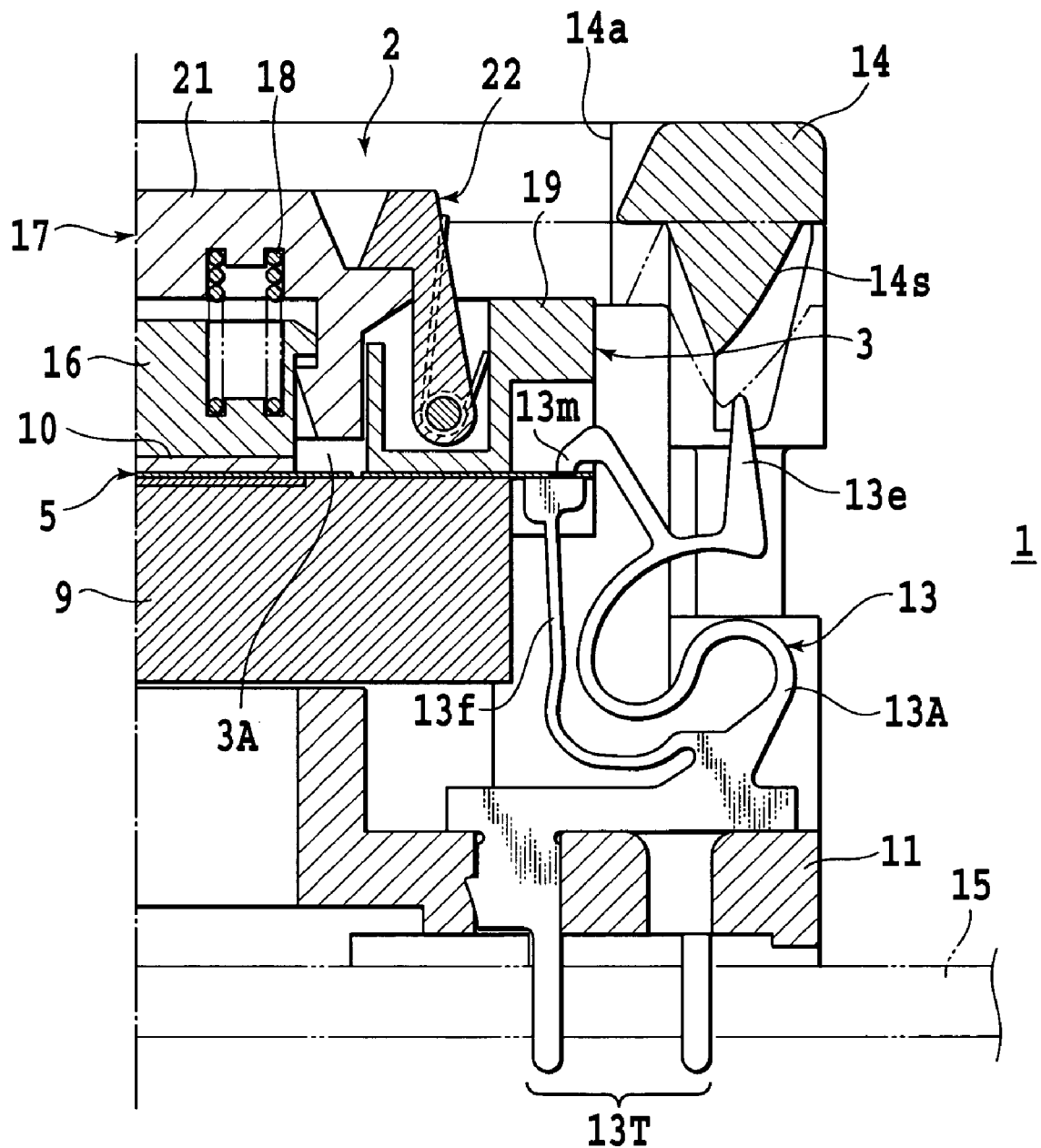
FIG. 4 is a partially sectional view illustrating the operation of the embodiment of the semiconductor device socket according to the present invention shown in FIG. 3.
Figure 5:
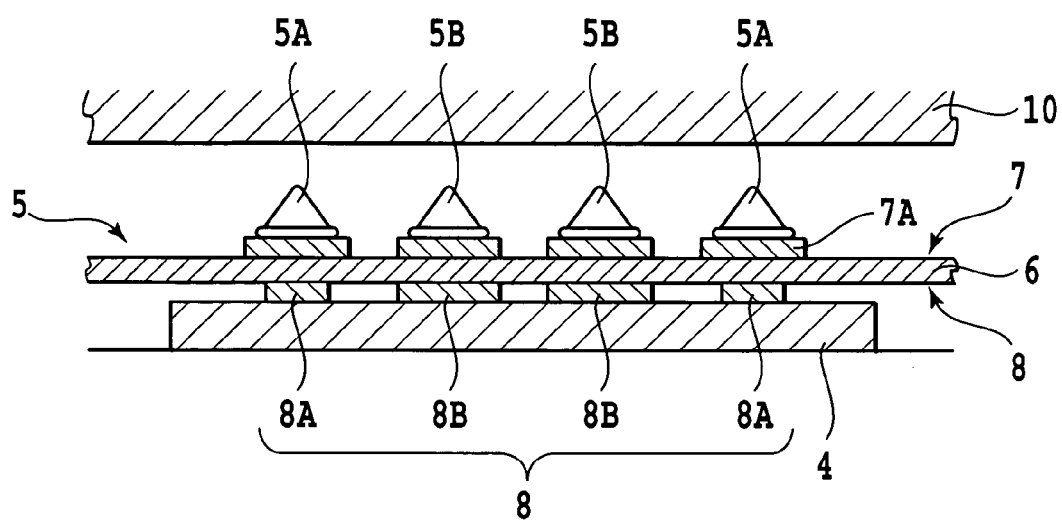
FIG. 5 is a sectional view schematically illustrating a main part of the semiconductor device carrier taken along a line V-V in FIG. 1.
Figure 6:
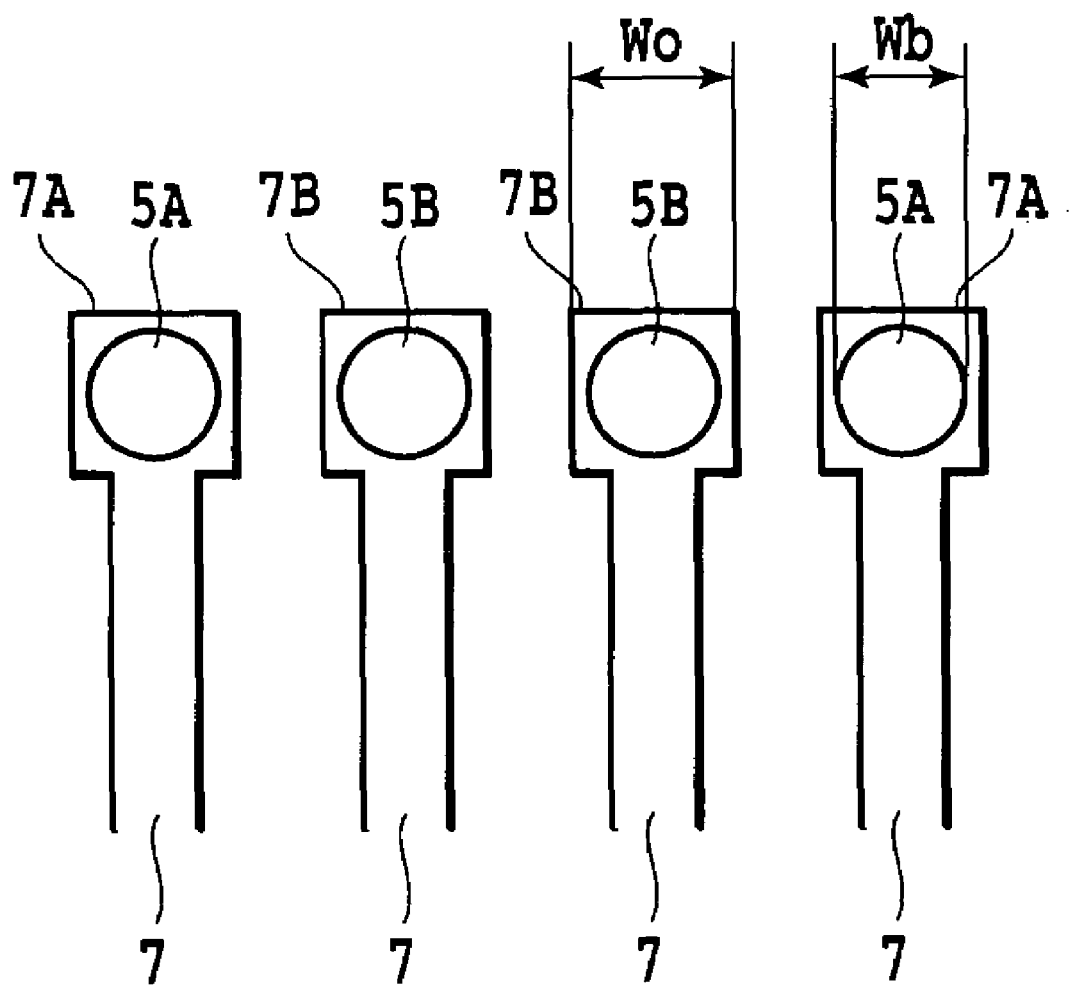
FIG. 6 is a plan view of a front surface wiring of electric contacts in the semiconductor device carrier in FIG. 5.
Figure 7:
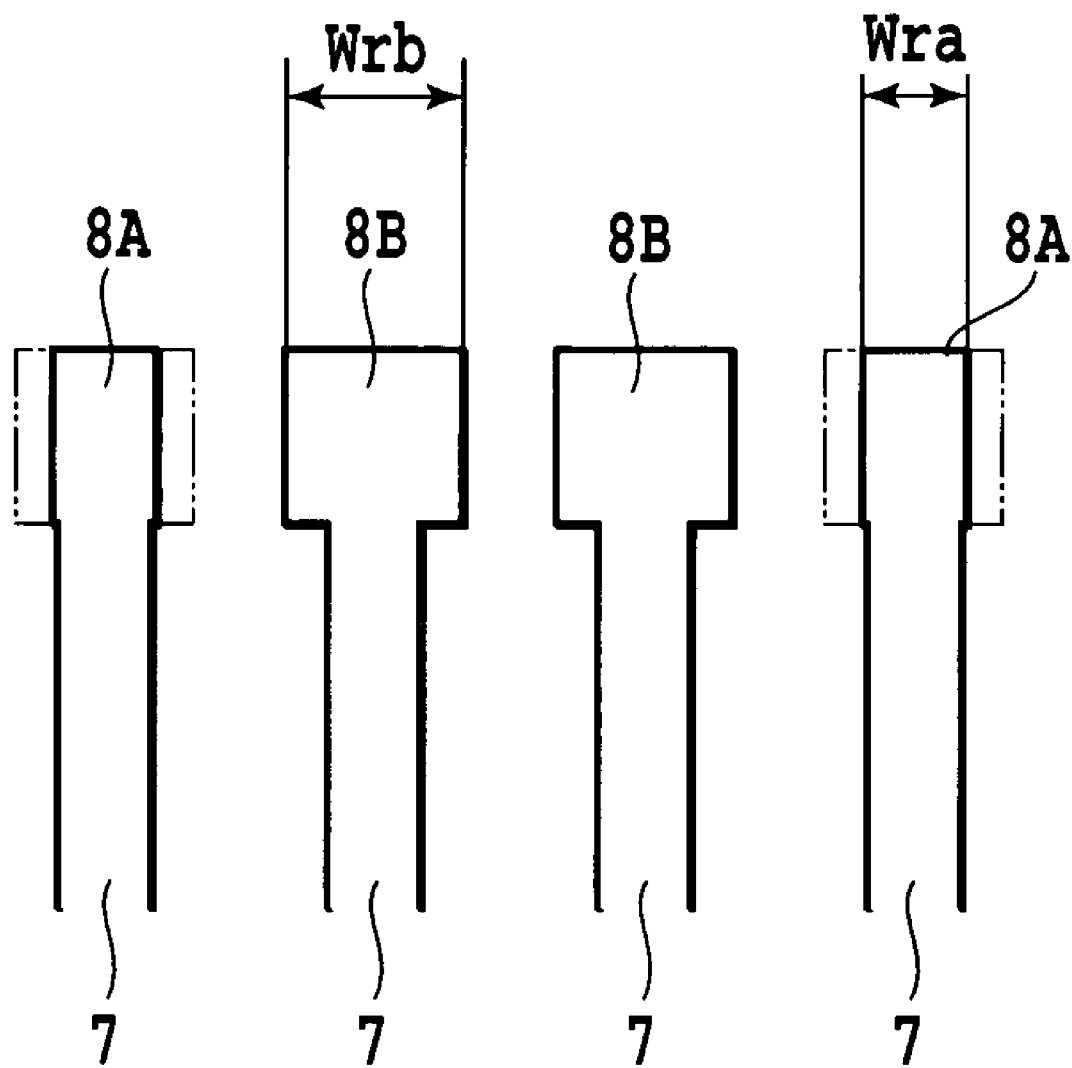
FIG. 7 is a plan view of a rear surface wiring of electric contacts in the semiconductor device carrier in FIG. 5.
Figure 8:
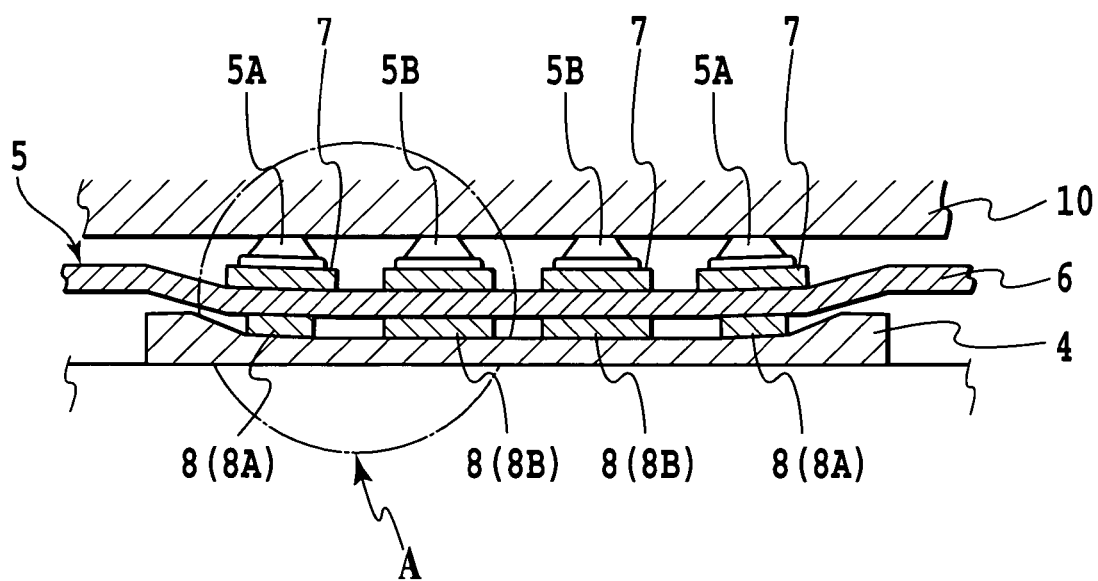
FIG. 8 is a vertical sectional view schematically illustrating the contacting state of the electrode section of the semiconductor device and the bump contacts.
Figure 9:
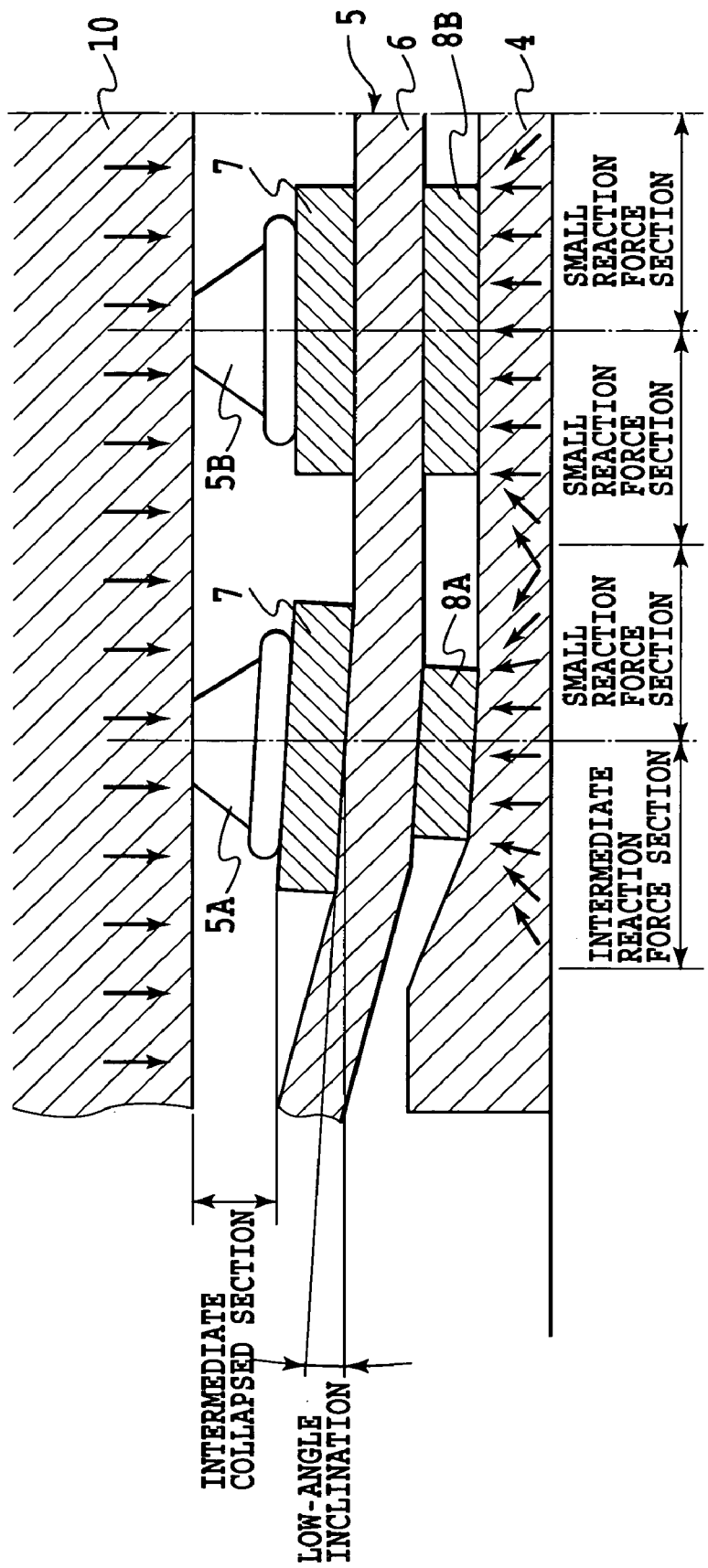
FIG. 9 is a partially enlarged view of part A in FIG. 8.
Figure 10:
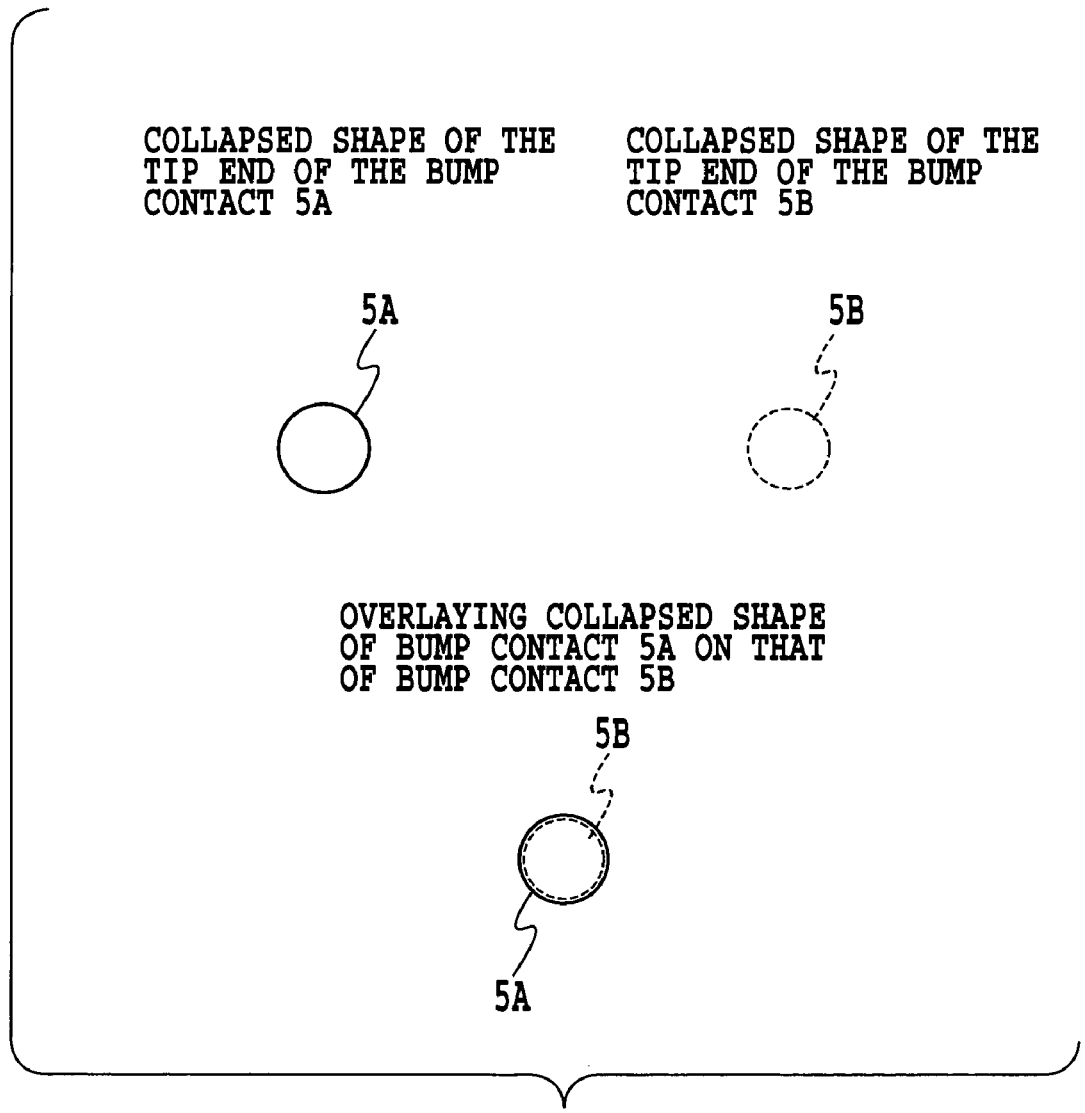
FIG. 10 schematically illustrates collapsed shapes of tip ends of the bump contacts shown in FIG. 9.

FIG. 1 is a partially plan view schematically illustrating one embodiment of a semiconductor device carrier in a semiconductor device socket according to the present invention; FIG. 2 is a partially sectional view of a main part of the semiconductor device carrier according to the present invention taken along a line II-II in FIG. 1; FIG. 3 is a partially sectional view schematically illustrating a total structure of the semiconductor device socket according to the present invention; FIG. 4 is a partially sectional view illustrating the operation of the embodiment of the semiconductor device socket according to the present invention shown in FIG. 3; FIG. 5 is a sectional view schematically illustrating a main part of the semiconductor device carrier taken along a line V-V in FIG. 1; FIG. 6 is a plan view of a front surface wiring of electric contacts in the semiconductor device carrier in FIG. 5; FIG. 7 is a plan view of a rear surface wiring of electric contacts in the semiconductor device carrier in FIG. 5; FIG. 8 is a vertical sectional view schematically illustrating the contacting state of the electrode section of the semiconductor device and the bump contacts; FIG. 9 is a partially enlarged view of part A in FIG. 8; and FIG. 10 schematically illustrates collapsed shapes of tip ends of the bump contacts.

As shown in FIGS. 1 and 2, a semiconductor device carrier 2 in a first embodiment according to the present invention includes a carrier housing 3 having an accommodating section 3A in which a bare chip, i.e., a semiconductor device 10 such as KGD (Known Good Die) is housed, a housing structure 19 forming the carrier housing 3, an elastic sheet 4 disposed on a base member 9 forming a bottom of the accommodating section 3A of the carrier housing 3, an electrode sheet 5 disposed on the base member 9 via the elastic sheet 4 and having bump contacts 5A, 5B, a pressing lid 17 for pressing an electrode section of a semiconductor device 10 onto the bump contacts 5A, 5B of the electrode sheet 5, and a latch mechanism 22 for selectively holding the pressing lid 17 in the carrier housing 3.

As shown in FIG. 2, the electrode sheet 5 includes an insulation substrate 6, a front surface wiring 7 arranged on a front surface of the insulation substrate 6 and a rear surface wiring 8 arranged on a rear surface of the insulation substrate 6, wherein the bump contacts 5A, 5B are provided on the front surface wiring 7. In this regard, although more bump contacts are practically provided, four bump contacts 5A and two bump contacts 5B are illustrated in FIG. 1 in an exaggerated manner as representatives for convenience of the explanation.

A plurality of pads are formed at opposite ends of the electrode sheet 5 projected outward, to be in contact with contacts 13 provided in a semiconductor device socket 1 described later to form the electric connection with the latter.

As shown in FIG. 2, the pressing lid 17 includes a pressing body 16 having a pressing surface to be in contact with the upper surface of the semiconductor device 10, a lid body 21 for housing a base of the pressing body 16, and a plurality of springs 18 for biasing the pressing body 16 disposed in a space defined between a recess of a base of the pressing body 16 and a recess of the lid body 21, toward the semiconductor device 10.

The semiconductor device socket 1 is illustrated in FIGS. 3 and 4.

The semiconductor device socket 1 is disposed on a printed circuit board 15 for inputting/outputting test signals to the semiconductor device 10 and detected output signals from the semiconductor device 10.

The semiconductor device socket 1 mainly includes a socket body 11 having a housing portion 12 for accommodating the semiconductor device carrier 2 therein, a contact group 13 provided in the socket body 11, consisting of a plurality of contacts 13A to be in contact with the respective pads of the electrode sheet 5 in the semiconductor device carrier 2, and a cover member 14 movable upward and downward relative to the socket body 11 to selectively and electrically connect the respective contact portions of the contacts 13A with the respective pads of the electrode sheet 5.

The socket body 11 molded with resinous material is located at a predetermined position in correspondence to the electrode section of the printed circuit board 15. As shown in FIG. 3, the socket body 11 has the housing portion 12 for accommodating the semiconductor device carrier 2 therein. The housing portion 12 is encircled by an inner wall of a lower base 12a to be engaged with a lower portion of the base member 9 in the semiconductor device carrier 2 and an inner wall of an upper base 12b consecutive to the base 12a to be engaged with an upper portion of the base member 9. The lower base 12a and the upper base 12b have slits into which the contacts 13A forming the contact group 13 are inserted.

Each of the contacts 13A includes a movable contact section 13m consecutive to a terminal section 13T press-fitting into the lower base 12a and electrically connected to the pad of the electrode sheet 5 from the upper side, and an engaged section 13e branched from the movable contact section 13m to be selectively engaged with a slanted portion of the cover member 14 to rotate the movable contact section 13m so that the movable contact section 13m moves away from a fixed contact section 13f.

The respective contacts 13A are arranged approximately vertical to a paper surface at a predetermined interval in correspondence to the pads in the electrode sheet 5. Among four groups 13 of the contacts encircling four sides of the housing portion 12, solely one contact group 13 corresponding to one side is shown in FIG. 3.

The cover member 14 molded with resinous material has an opening 14a allowing the semiconductor device carrier 2 to pass therethrough. A frame-like portion forming the periphery of the opening 14a is supported to be movable upward and downward by a leg guided by a groove provided in the outer circumference of the socket body 11. The cover member 14 is biased by an elastic member not shown to be away from the socket body 11. At a lower end of the respective side of the frame-like portion, a slanted portion 14s is formed as indicated by a chain double-dashed line in FIG. 4, engageable with the engaged section 13e of the respective contact 13A when the cover member 14 descends to a predetermined position to rotate the movable contact section 13m against the elastic force thereof away from the fixed contact section 13f.

When the semiconductor device carrier 2 is mounted to the housing portion 12 of the socket body 11 in the semiconductor device socket 1, the cover member 14 is held while being pushed downward at a predetermined distance, whereby after the respective movable contact section 13m in the contact group 13 moves backward relative to the housing portion 12, the semiconductor device carrier 2 is located within the housing portion 12 through the opening 14a from above. At that time, the fixed contact section 13f is brought into contact with the lower surface of the pad of the electrode sheet 5 in the semiconductor device carrier 2.

Subsequently, when the cover member 14 is released from the held state, the cover member 14 rises by a resultant force of the repulsion of the elastic member and the elastic force of the engaged sections 13e in the respective contacts 13A. At that time, the respective movable contact section 13m returns to the original position and is brought into contact with the upper surface of the pad of the electrode sheet 5 in the semiconductor device carrier 2. Thereby, as shown in FIG. 4, the electrode sheet 5 is electrically connected to the contact group 13.

An electric contact structure of the semiconductor device carrier 2 in a first embodiment of the present invention illustrated in FIGS. 5 to 7 includes the electrode sheet 5 and the elastic sheet 4 disposed on the lower surface of the electrode sheet 5.

The electrode sheet 5 includes the insulation substrate 6, a front surface wiring 7 and a rear surface wiring 8 conductively wired on the front and rear surfaces, respectively, of the insulation substrate 6, the bump contacts 5A arranged on the front surface wiring 7 and in contact with the electrode section (not shown) at the extremity of the semiconductor device 10, and the bump contacts 5B arranged on the front surface wiring 7 and in contact with the electrode section (not shown) in a central area of the semiconductor device 10. In this regard, in FIG. 5, among a plurality of bump contacts arranged on the surface wirings 7 and 8, four of them are illustrated in an exaggerated manner for the purpose of assisting the understanding of the explanation.

The insulation substrate 6 is made of an insulative thermosetting resinous sheet such as polyimide of approximately several tens μm thick.

The front surface wiring 7 has a bump arrangement section 7A wherein the bump contact 5A or 5B is disposed.

The bump arrangement section 7A is approximately of a square shape, at a center of which is disposed the bump contact 5A or 5B. A width Wo of the bump arrangement section 7A is slightly larger than a diameter Wb of the bump contact 5A as shown in FIG. 6.

The rear surface wiring 8 has a rear surface bump placement wiring 8A at the respective end in correspondence to the bump contact 5A to be in contact with the electrode section at the respective end of the semiconductor device, and a rear surface bump placement wiring 8B in correspondence to the bump contact 5B to be in contact with the central electrode section of the semiconductor device 10 as shown in FIG. 7.

The rear surface bump placement wiring 8A is of a rectangular shape formed by cutting off opposite sides of the bump arrangement section 7A, as apparent from the comparison with a transparent line (chain double-dashed line) of the bump arrangement section 7A (see FIG. 6) shown in FIG. 7.

A width Wra of the rear surface bump placement wiring 8A disposed at the extremity is smaller than a diameter Wb of the bump contact 5A.

The rear surface bump placement wiring 8B is of approximately the same shape as the bump arrangement section 7A which is of a square shape.

A width Wrb of the rear surface bump placement wiring 8B is slightly larger than a diameter of the bump contact 5A, 5B.

In such a manner, the rear surface bump placement wiring 8A disposed at the extremity in correspondence to the bump contact 5A in contact with the extremity of the electrode section in the semiconductor device 10 is formed to have a width smaller than that of the rear surface bump placement wiring 8B in correspondence to the adjacent bump contact 5B in contact with the center of the electrode section in the semiconductor device 10.

The elastic sheet 4 is made, for example, of an elastic sheet such as rubber or silicone rubber and disposed on the lower surface of the electrode sheet 5.

The elastic sheet 4 absorbs the variation of a height of the bump contacts 5A or 5B and applies an elastic force (reaction force) actually necessary when the bump contact 5A, 5B are brought into contact with the electrode section in the semiconductor device 10.

As shown in FIG. 8, the electrode section in the semiconductor device 10 is pushed by the pressing body 16 of the pressing lid 17 and in contact with the bump contacts 5A, 5B.

The elastic sheet 4 resiliently deforms by the pressure applied via the semiconductor device 10 so that a central area thereof becomes concave. Thus, a reaction force against the pressure generates therein.

At that time, as shown in FIG. 9, substantially a vertical reaction force of the elastic sheet 4 is applied via the rear surface wiring 8 (more accurately, the rear surface bump placement wiring 8B) to the bump contact 5B in contact with the center of the electrode section in the semiconductor device 10.

Since a width of the front surface bump placement wiring 8A is smaller than a diameter of the bump contact 5A to be in contact with the extremity of the terminal section in the semiconductor device 10, the reaction force of the elastic sheet 4 is prevented from obliquely applying to the bump contact 5A. Thereby, the bump contact 5A is slightly inclined relative to the horizontal plane more than the bump contact 5B does.

In such a case, as shown in FIG. 10, the difference in the degree of wear can be minimized as apparent when the collapsed shapes of the tip ends of the bump contacts 5A and 5B are laid together.

Accordingly, the electric connection is obtainable at any times even if a plurality of tests are repeated, resulting in the increase in the life span of the electrode sheet 5 as well as the improvement in the test availability.

(Modification)

FIGS. 11 to 15 illustrate modifications of the rear surface wiring in the first embodiment. In these modifications, the same elements as in the first embodiment are denoted by the same reference numerals and the explanation thereof will be eliminated.

Figure 11:
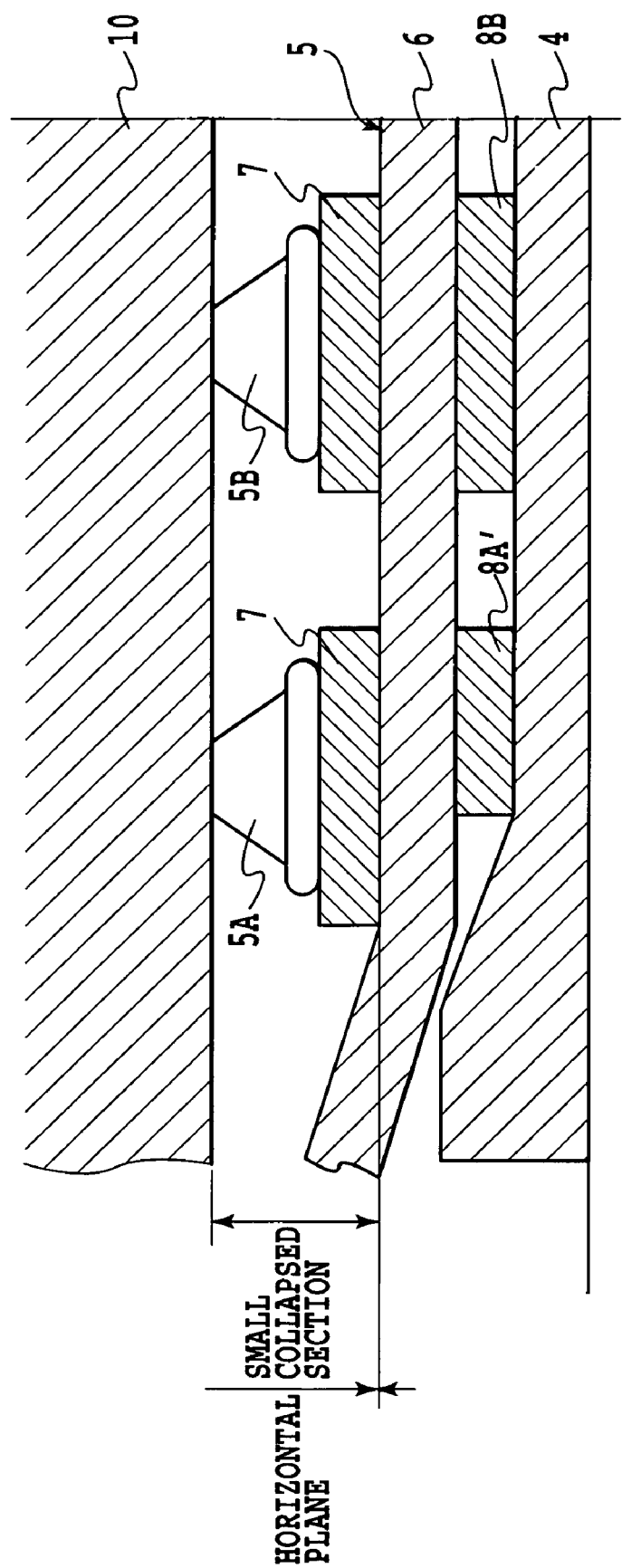
FIG. 11 is a vertical sectional view partially illustrating another example of a rear surface wiring pattern in the first embodiment of the inventive electric contact structure shown in FIG. 4.
Figure 12:
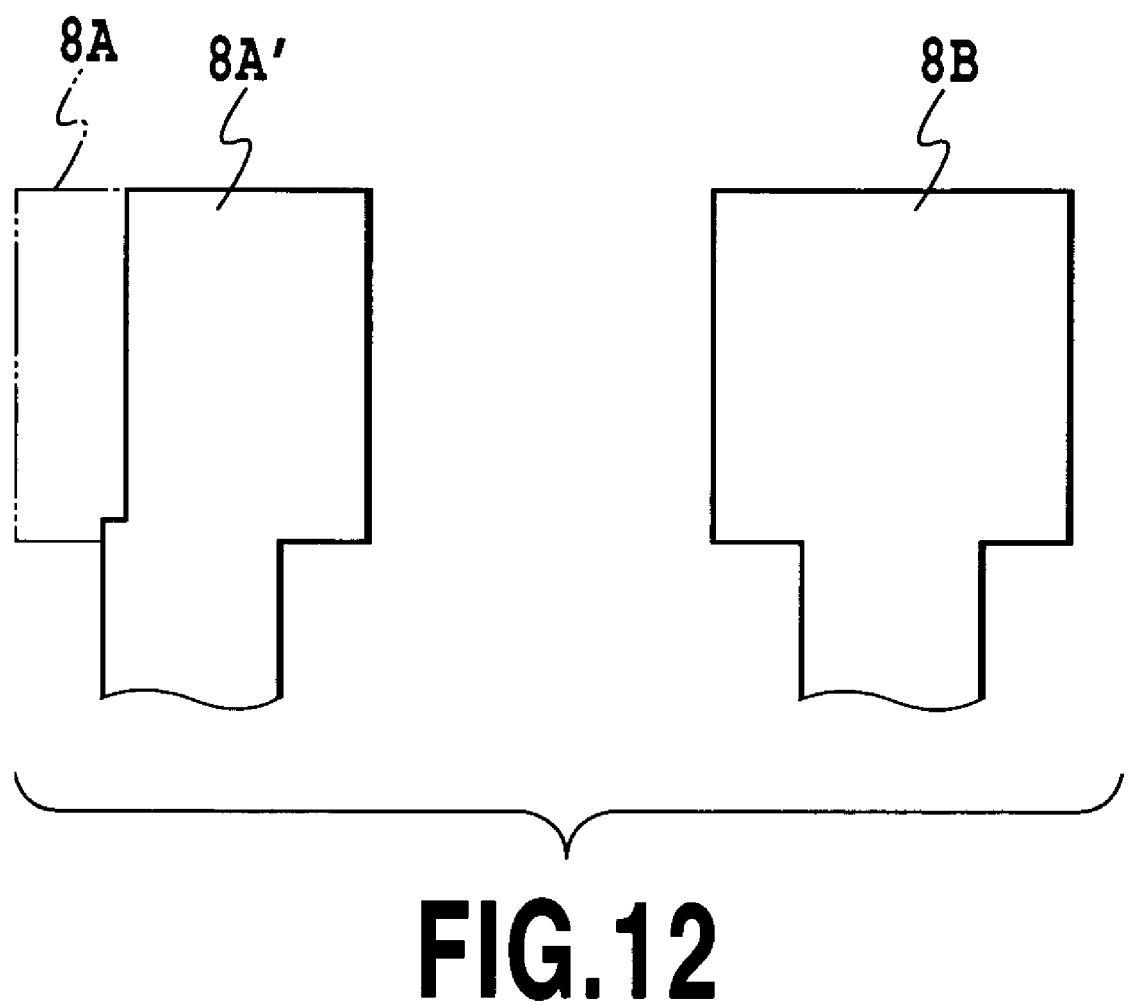
FIG. 12 is a partial plan view of the rear surface wiring pattern shown in FIG. 11.

As shown in FIGS. 11 and 12, there is a difference in a rear surface bump placement wiring 8A' of the extreme bump contact 5A to be in contact with the extreme electrode section in the semiconductor device 10 from the rear surface bump placement wiring 8A in the first embodiment that the former has a shape formed by cutting off one end (on the extremity side) thereof.

By shaping the extreme rear surface bump placement wiring in such a manner, the inclination of the extreme bump contact 5A described above is further minimized when the electrode section of the semiconductor device 10 are brought into contact with the bump contacts 5A, 5B, in comparison with the shape obtained by cutting off the opposite ends of the rear surface bump placement wiring.

Figure 13:
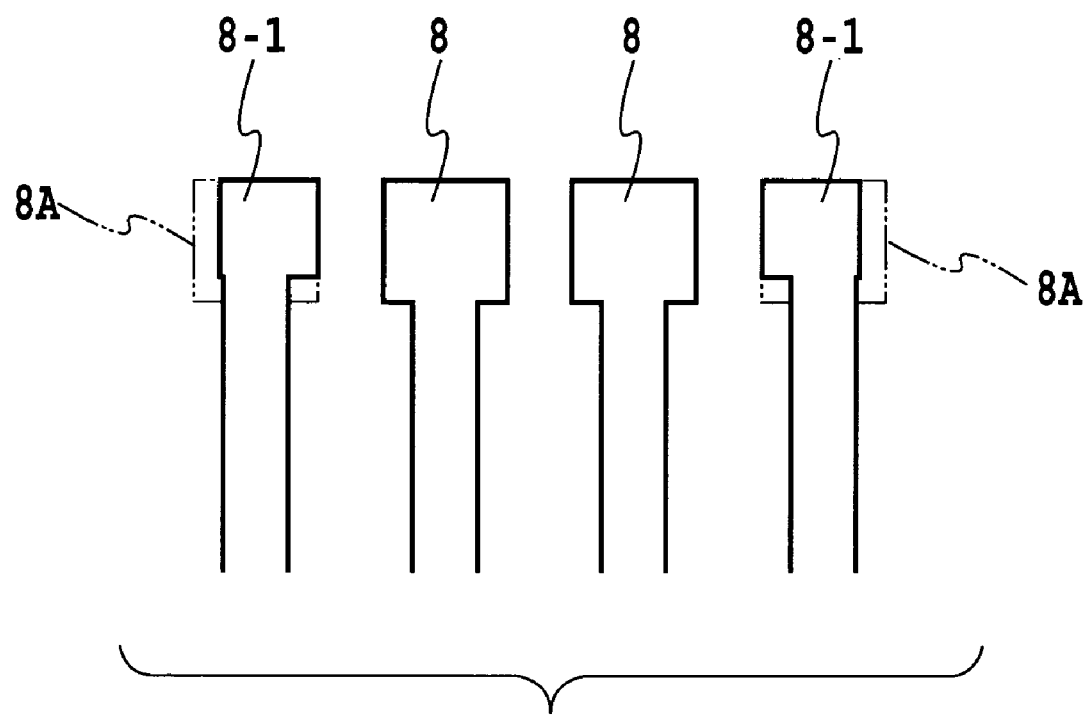
FIG. 13 is a partial plan view illustrating a first modification of a wiring pattern of the inventive electric contact structure.
Figure 14:
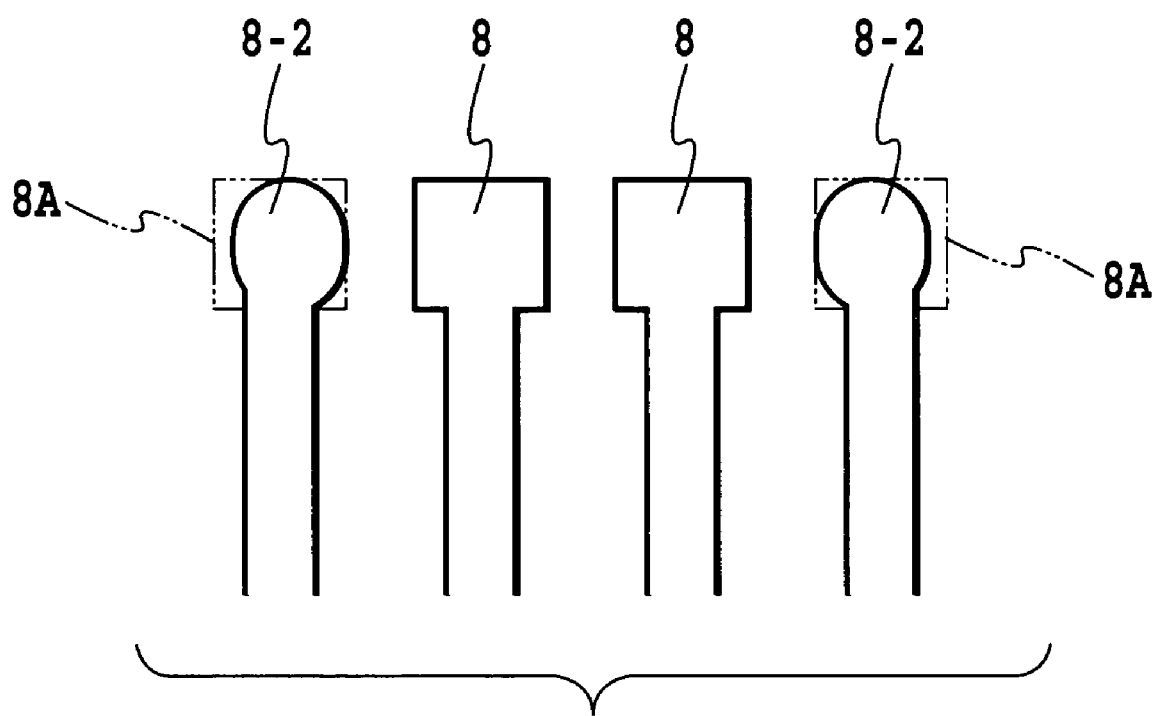
FIG. 14 is a partial plan view illustrating a second modification of a wiring pattern of the inventive electric contact structure.
Figure 15:
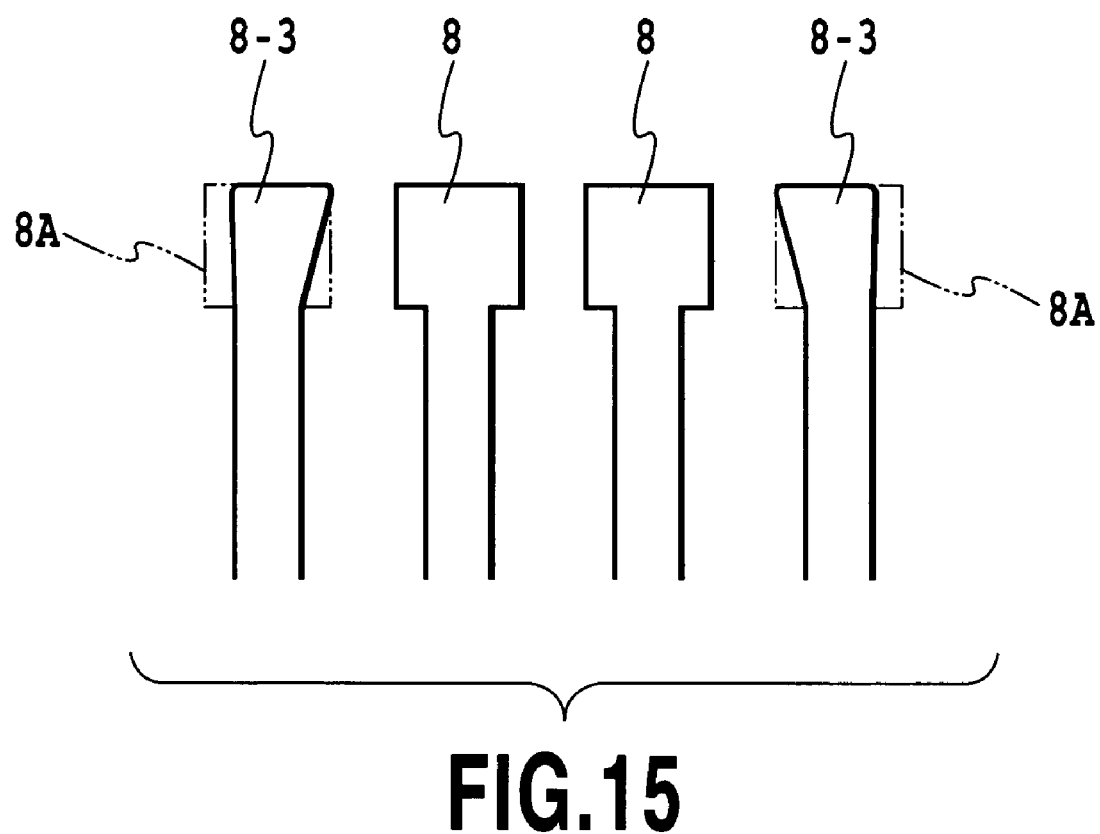
FIG. 15 is a partial plan view illustrating a third modification of a wiring pattern of the inventive electric contact structure.

As shown in FIGS. 13 to 15, the extreme rear surface bump placement wiring may be a rear surface a rear surface bump arrangement 8-1 having a shape formed by cutting off one end (on the extreme side) and a part of a center side in the rear surface bump placement wiring 8A described above.

The opposite ends may be cut off from the rear surface bump placement wiring 8A described above in an oval shape so that the extremity side is cut off larger than the center side, resulting in an extreme rear surface bump placement wiring 8-2 (see FIG. 14).

As shown in FIG. 15, the extreme side of the rear surface bump placement wiring 8A described above may be cut off in a rectangular shape and the center side thereof may cut off in a triangular shape to form a rear surface bump placement wiring 8-3 having the same effect as the above modifications. In this case, the same effect can be produced.

(Applications)

Figure 16:
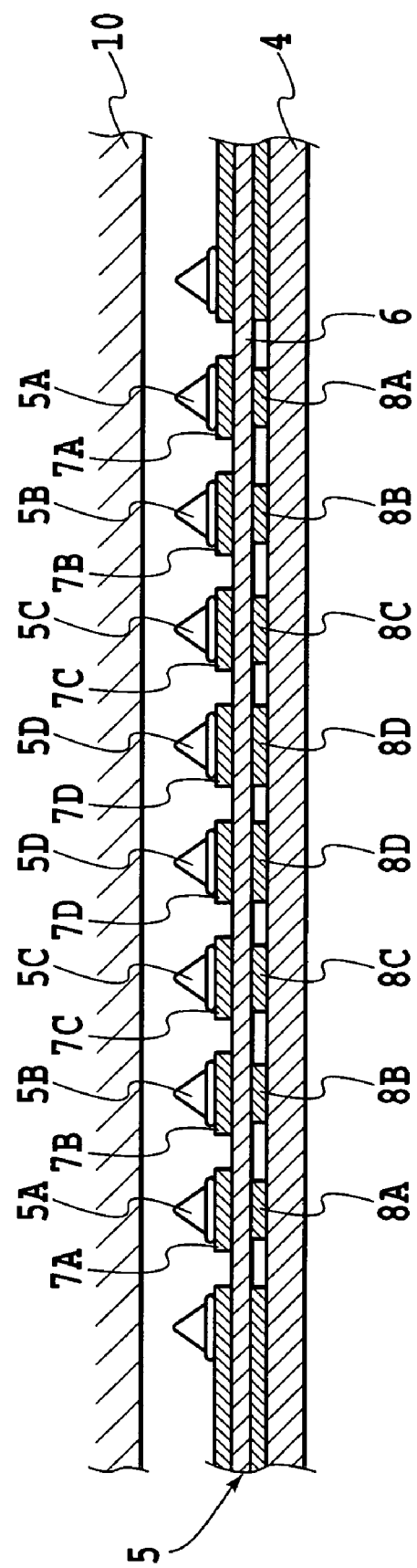
FIG. 16 is a sectional view schematically illustrating a main part of electric contacts in the semiconductor device carrier which is one application of the first embodiment having many electrode sections in the semiconductor device.
Figure 17:
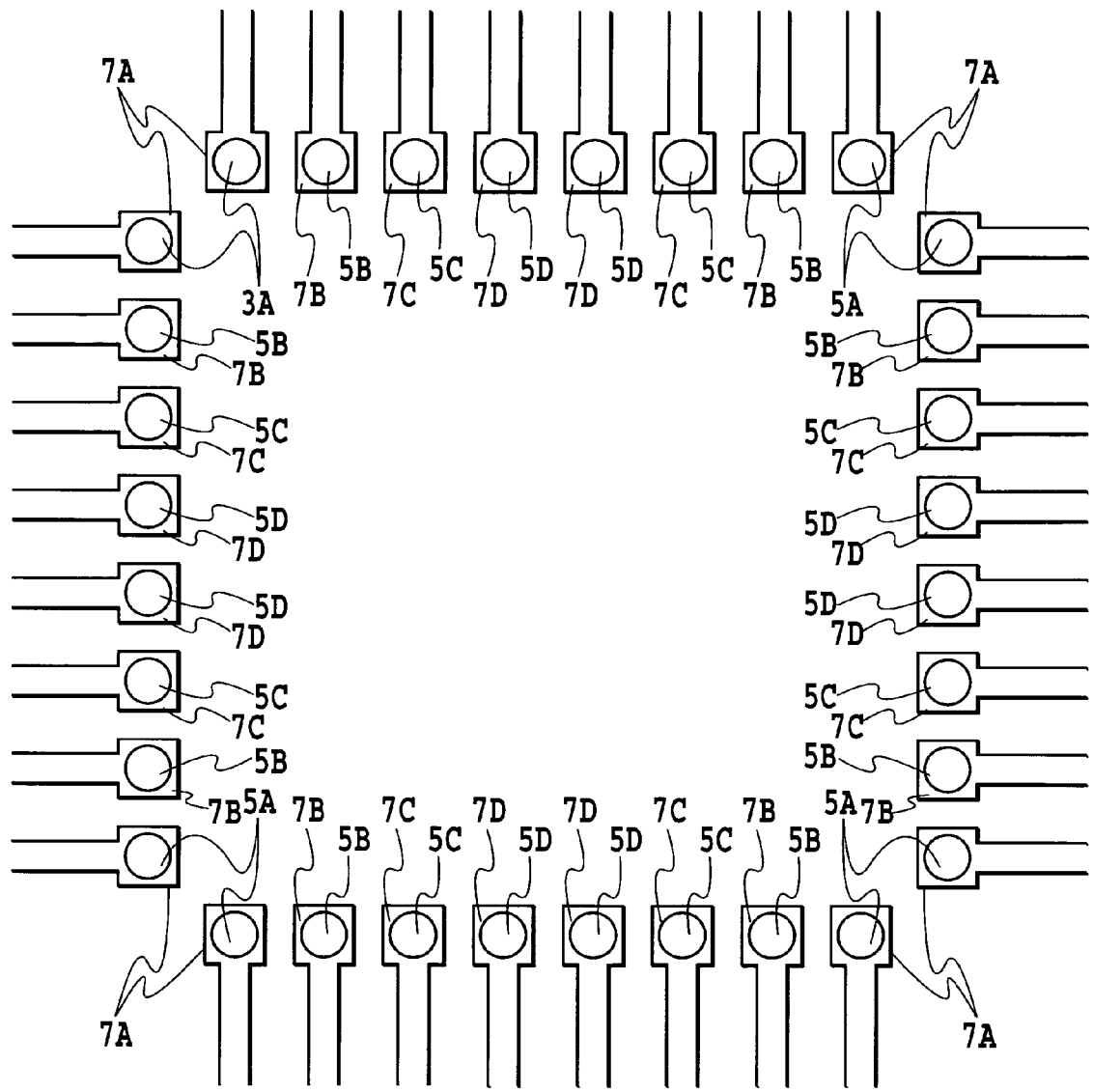
FIG. 17 is a plan view of a front surface wiring of important points of electric contacts in the semiconductor device carrier in FIG. 16.
Figure 18:
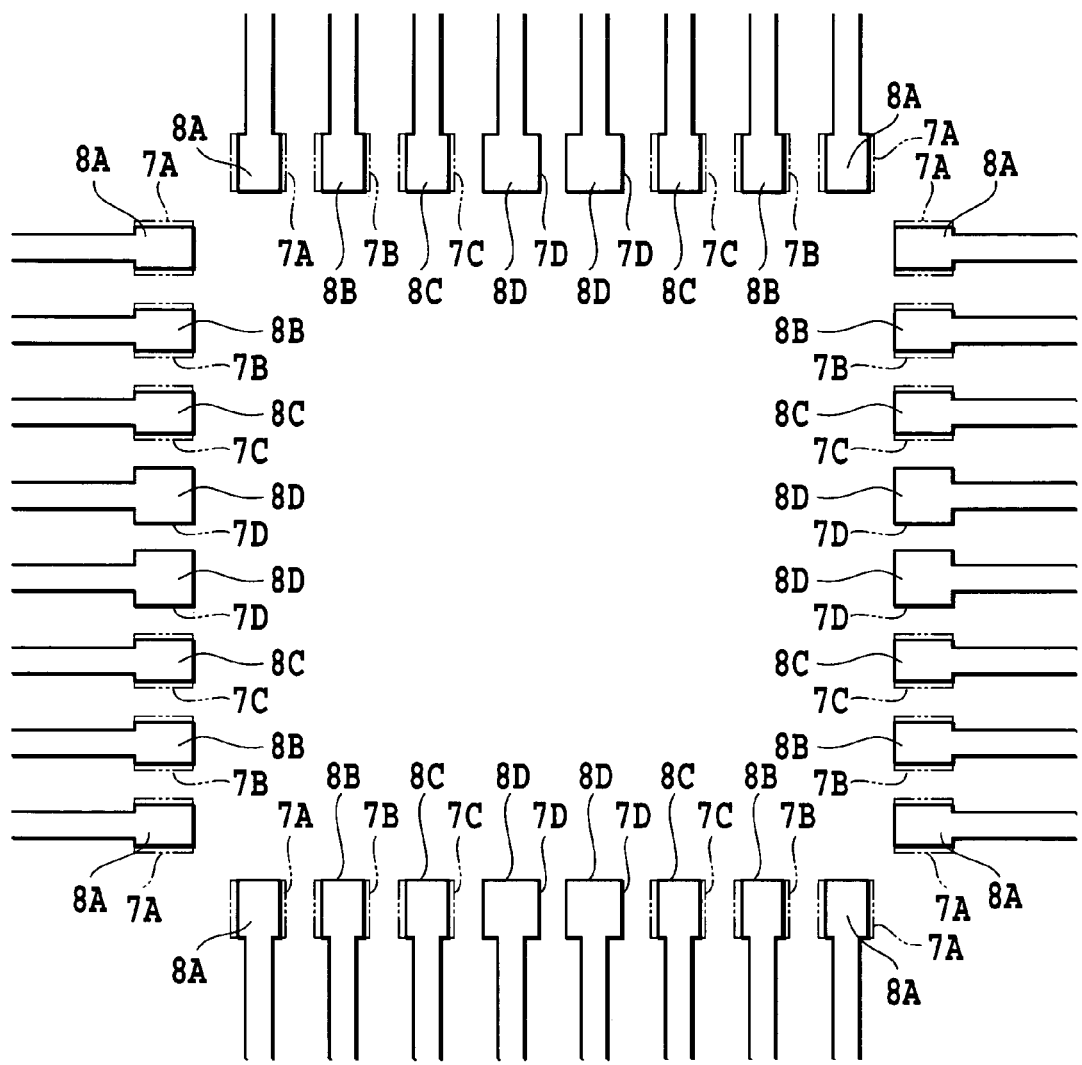
FIG. 18 is a plan view of a rear surface wiring of important points of electric contacts in the semiconductor device carrier in FIG. 16.
Figure 19:
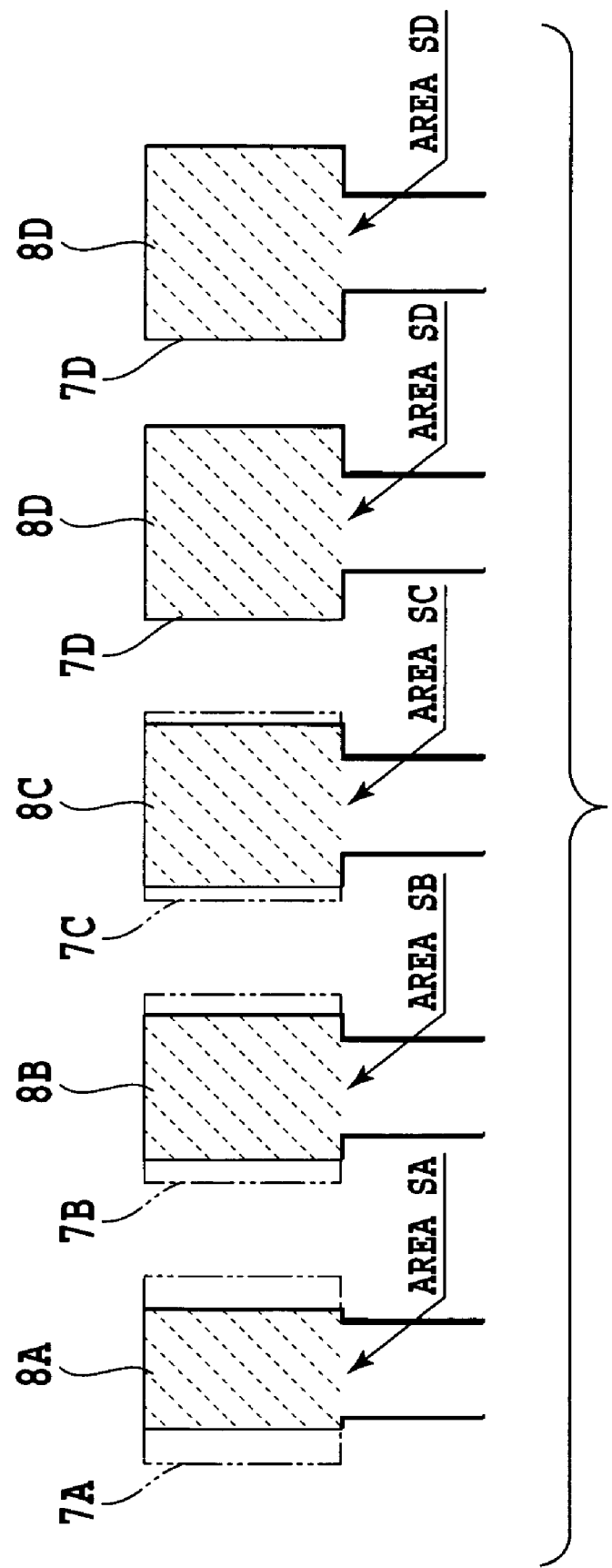
FIG. 19 is an enlarged view wherein the front surface wiring shown in FIG. 17 is laid on a top of the rear surface wiring shown in FIG. 18.

An application of the first embodiment having many electrode sections is illustrated in FIGS. 16 to 19, wherein FIG. 16 is a sectional view schematically illustrating a main part of electric contacts in the semiconductor device carrier; FIG. 17 is a plan view of a front surface wiring of electric contacts in the semiconductor device carrier in FIG. 16; FIG. 18 is a plan view of a rear surface wiring of electric contacts in the semiconductor device carrier in FIG. 16; and FIG. 19 is an enlarged view wherein the front surface wiring shown in FIG. 17 is laid on a top of the rear surface wiring shown in FIG. 18.

In the drawings, the same elements as in the first embodiment are denoted by the same reference numerals and the explanation thereof will be eliminated.

The difference of this application from the first embodiment is that a width of the rear surface bump placement wiring in the rear surface wiring 8 becomes smaller as it is closer from the central electrode to the extreme electrode of the semiconductor device.

As shown in FIG. 17, bump contacts 5A, 5B, 5C and 5D corresponding to the electrode section of the semiconductor device 10 are arranged in bump arrangement sections 7A, 7B, 7C and 7D of front surface wirings 7.

As shown in FIG. 18, rear surface bump placement wirings 8A, 8B, 8C and 8D of the same number as that of the bump arrangement sections 7A, 7B, 7C and 7D are arranged via an insulation substrate 6 (chain double-dashed lines in the drawing represent the bump arrangement sections 7A, 7B, 7C and 7D as they are transparent).

As shown in FIG. 19, in the rear surface bump placement wirings 8A, 8B, 8C and 8D, the extreme rear surface bump placement wiring 8A has the smallest area SA, and an area SB of the bump placement wiring 8B disposed adjacent to the extreme rear surface bump placement wiring 8A has a smaller portion to be cut off from the bump placement section 7A than that of the extreme rear surface bump placement wiring 8A.

Further, an area SC of the bump placement wiring 8C has a smaller portion to be cut off from the bump placement section 7C than that of the extreme rear surface bump placement wiring 8B. In such a manner, widths of the rear surface bump placement wirings 8B, 8C and 8D become smaller as being closer to the rear surface bump placement wirings 8A.

Since the width of the rear surface bump placement wiring 8 becomes smaller as being closer to the extreme rear surface bump placement wiring 8A as described above, it is possible to prevent the reaction force from obliquely applying to the bump contact even if the number of the electrode sections of the semiconductor device increases, whereby the erroneous contact of the bump contacts 5A to 5D due to the inclination thereof is avoidable.

Further, as a modification of the application shown in FIG. 19, it is possible to avoid the oblique contact of the bump contact by cutting off solely an extreme side portion, not both ends, of the rear surface bump placement wirings 8A to 8D from the bump arrangement section 7A.

Second Embodiment

Figure 20:
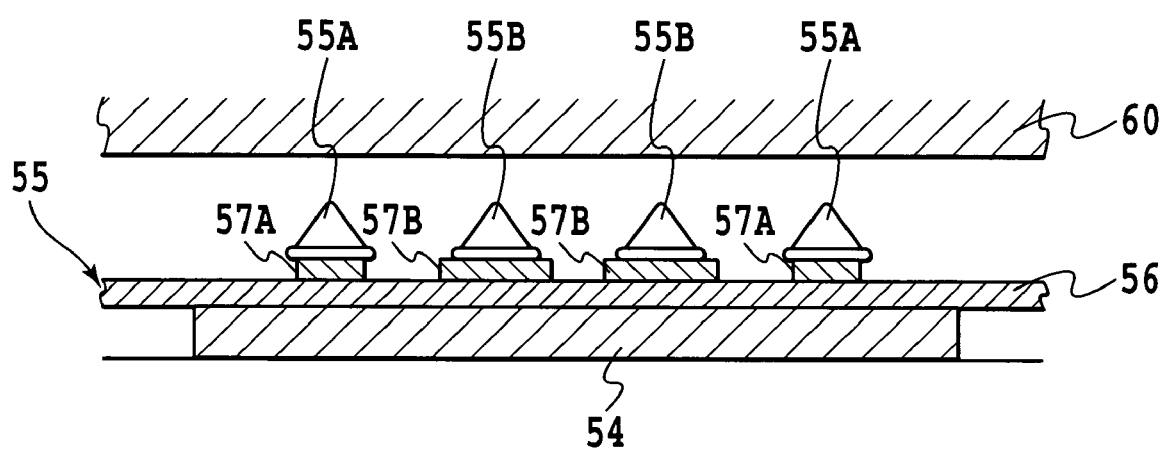
FIG. 20 is a vertical sectional view illustrating an initial state of a second embodiment of the inventive electric contact structure.
Figure 21:
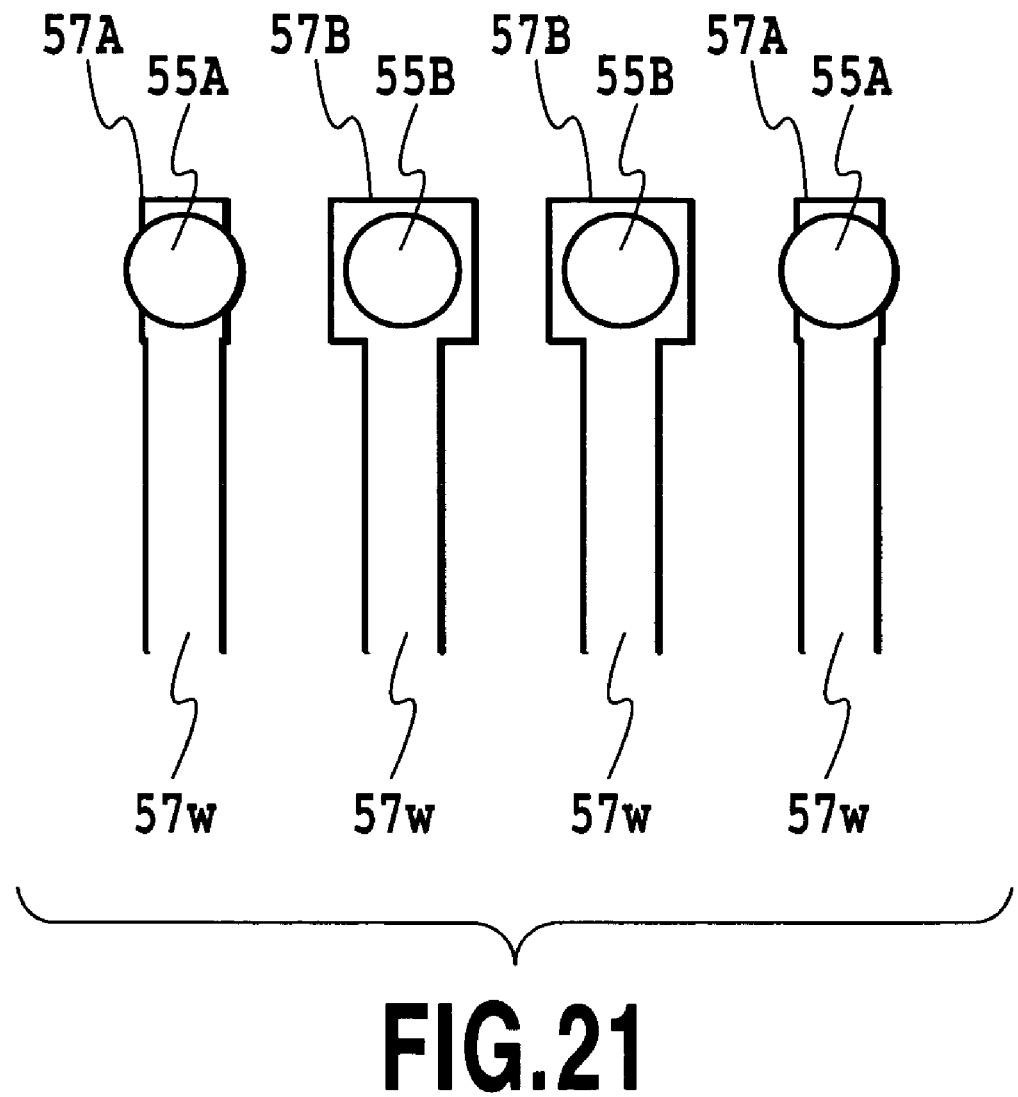
FIG. 21 is a partial plan view of the front surface wiring pattern in the second embodiment of the inventive electric contact structure shown in FIG. 20.
Figure 22:
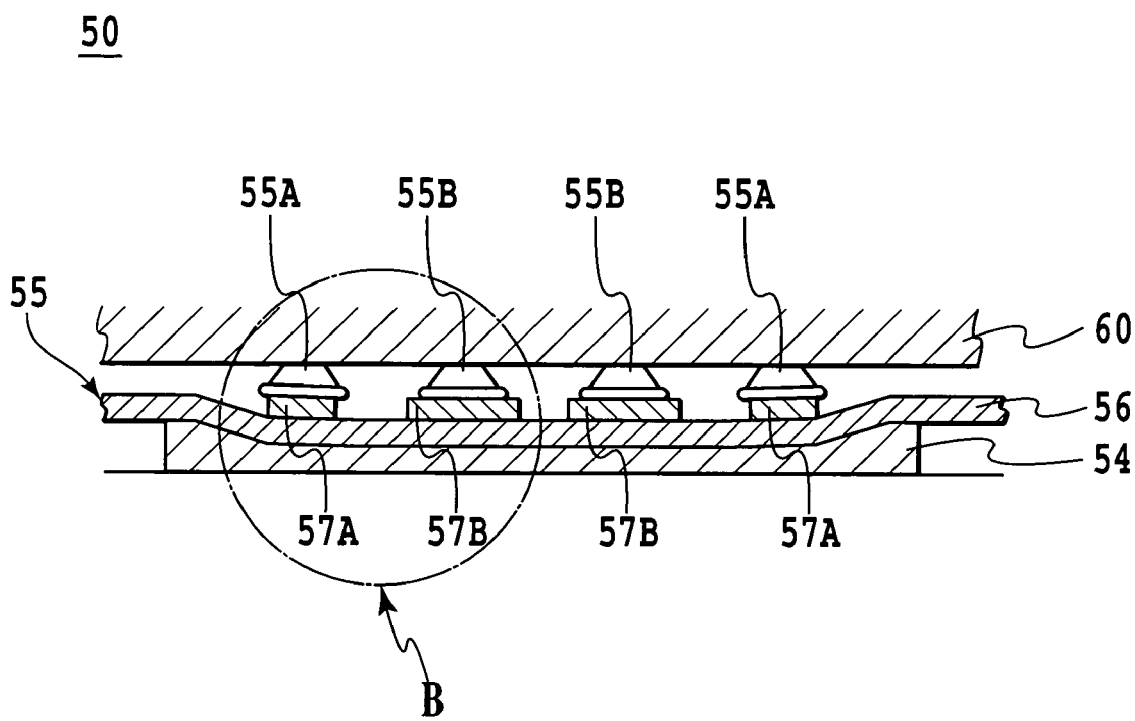
FIG. 22 is a vertical sectional view partially illustrating a contacting state of the second embodiment of the inventive electric contact structure shown in FIG. 20.
Figure 23:
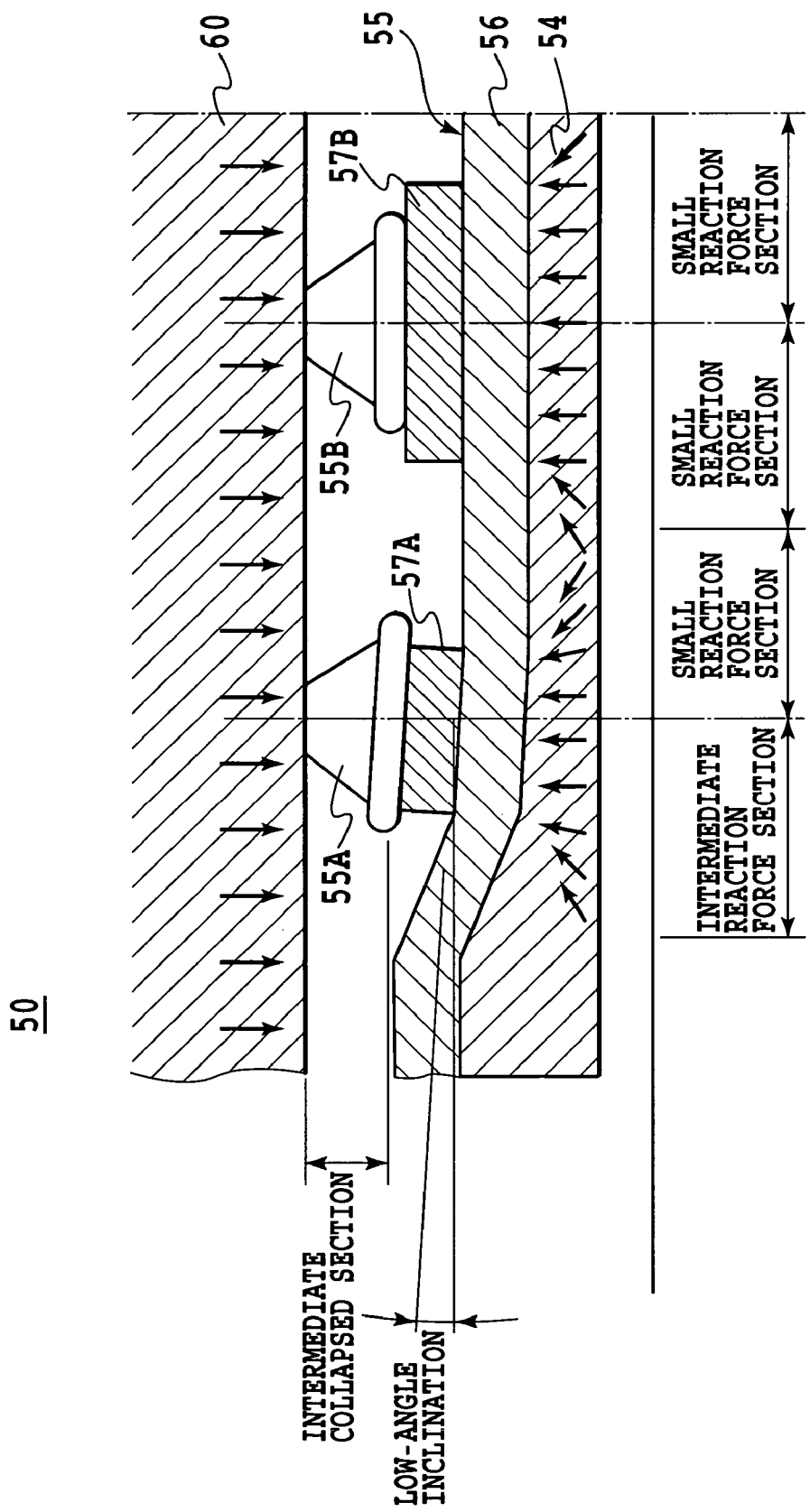
FIG. 23 is an enlarged view of part B in FIG. 22.
Figure 24:
FIG. 24 is a partial plan view of collapsed shapes of tip ends of the bump contacts shown in FIG. 23.
Figure 24:
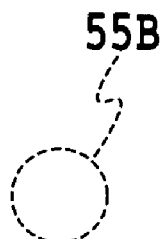
Figure 24:
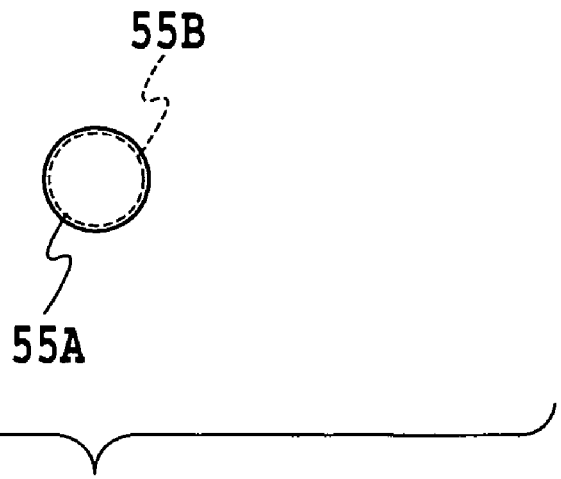

A second embodiment of the present invention is illustrated in FIGS. 20 to 24 wherein FIG. 20 is a sectional view schematically illustrating a main part of an electric contact structure in a semiconductor device carrier of a second embodiment; FIG. 21 is a plan view of the front surface wiring pattern of the electric contact structure in the semiconductor device carrier shown in FIG. 20; FIG. 22 is a vertical sectional view illustrating a contacting state of the semiconductor device and the bump contact; FIG. 23 is an enlarged view of part B in FIG. 22; and FIG. 24 is a plan view of collapsed shapes of tip ends of the bump contacts shown in FIG. 23;

The second embodiment is different from the first embodiment in that the conductor circuit provided on an insulation substrate for the electrode sheet is arranged solely on the front surface thereof and there are no rear surface wiring patterns.

That is, as illustrated, an electric contact structure 50 in the second embodiment solely using the front surface wiring patterns includes an electrode sheet 55 and an elastic sheet 54 disposed on the lower surface of the electrode sheet 55.

The electrode sheet 55 includes an insulation substrate 56, front surface wirings 57A, 57B conductively formed on the front surface of the insulation substrate 56, and bump contacts 55A, 55B arranged on the front surface wirings 57A, 57B to be in contact with a central electrode section (not shown) of a semiconductor device 60. In this regard, in FIG. 20, the bump contacts 55A, 55B in a plurality of bump contacts are exaggeratedly shown as the representative for convenience of explanation.

The insulation substrate 56 is preferably a sheet of insulative thermosetting resinous material such as polyimide resin.

In the electric contact structure 50 of the second embodiment, the front surface wirings 57A, 57B are provided on the front surface of the insulation substrate 56, and the bump contacts 55A, 55B are arranged thereon. Such an insulation substrate 56 is provided directly on the elastic sheet 54 used as a pressing member. Accordingly, the bump contacts 55A, 55B are pressed due to the elastic force of the elastic sheet 54 directly onto the electrode section of the semiconductor device 60 via the insulation substrate 56 and the front surface wirings 57A, 57B.

As describe above, according to the electric contact structure 50 in the second embodiment, the bump contacts 55A, 55B used as contact members are formed on a plurality of front surface wirings 57A, 57B of the insulation substrate 56 disposed on the elastic sheet 54. Portions 57w connected to ends of the front surface wirings 57A, 57B provided on the front surface have the same size even if they are located either at the extremity or in other portions, as shown in FIG. 21.

That is, sizes of the front surface wiring 57A, 57B provided on the front surface of the insulation substrate 56 are adjusted stepwise in correspondence to magnitudes of reaction forces from the elastic sheet 54. That is, an area of the front surface wiring increases from the extreme front surface wiring 57A toward the inner side front surface wiring 57B. That is, the outer side front surface wiring 57A has a smaller width than that of inner side front surface wiring 57B as shown in the drawing.

The bump contacts 55A, 55B in the electric contact structure 50 of the second embodiment are formed so that an area and width of the front surface wiring 57A disposed beneath the extreme bump contact 55A is smaller in a area and width than the front surface wiring 57B beneath the other bump contact 55B adjacent to the former.

A state that the electric contact structure 50 described above is brought into press-contact with the electrode section in the semiconductor device 60 by the elastic sheet 54 is shown in FIGS. 22 to 24, wherein FIG. 22 is a vertical sectional view illustrating a collapsed state of tip ends of the bump contacts due to the pressure; FIG. 23 is a partially enlarged view of part B in FIG. 22, and FIG. 24 is a plan view illustrating a collapsed state of tip ends of the bump contacts in the electric contact structure wherein the bump contact 55A and the bump contact 55B are laid together.

That is, as illustrated, the electric contact structure 50 in the second embodiment wherein the front surface wirings 57A, 57B are solely used includes the insulation substrate 56, the bump contacts 55A, 55B disposed on the front surface wirings 57A, 57B of the insulation substrate 56, and the elastic sheet 54 on which the insulation substrate 56 is arranged. Due to the elasticity of the elastic sheet 54, the bump contacts 55A, 55B on the front surface wirings 57A, 57B are brought into contact with the electrode section of the semiconductor device 60 via the insulation substrate 56.

In such an electric contact structure 50 according to the second embodiment, the front surface wirings 57A, 57B are provided on the surface of the flexible insulation substrate 56 and the bump contacts 55A, 55B are arranged thereon. The insulation substrate 56 is disposed directly on the elastic sheet 54. Accordingly, the bump contacts 55A, 55B is brought into press-contact with the electrode section in the semiconductor device 60 via the insulation substrate 56 and the front surface wirings 57A, 57B due to the elasticity of the elastic sheet.

As described above, according to the electric contact structure 50 in the second embodiment, the bump contacts 55A, 55B are provided on a plurality of front surface wirings 57A, 57B arranged on the insulation substrate 56 disposed on the elastic sheet 54 in the same manner as usual contacts are provided. The front surface wirings 57A, 57B provided on the surface thereof are formed so that the outside front surface wiring 57A in correspondence to the extreme bump contact has a smaller width than the inside front surface wiring 57B to minimized the reaction force. That is, the front surface wiring 57A on the insulation substrate 56 has a smaller width than the inside front surface wiring 57B.

The bump contacts 55A, 55B in the electric contact structure 50 according to the second embodiment are formed so that an area of the front surface wiring 57A beneath the bump contact 55A disposed at the extremity is smaller than that of the front surface wiring 57B beneath the inside bump contact 55B.

FIGS. 22 and 23 shows a state wherein the electric contact structure 50 described above is pressed to be in contact with the semiconductor device 60 due to the elasticity of the elastic sheet 54.

As illustrated, when the electric contact structure 50 is pressed to be in contact with the semiconductor device 60 due to the elasticity of the elastic sheet 54, tip ends of the bump contacts 55A, 55B collapse and the surface of the elastic sheet 54 resiliently bends to form a recess. In this case, the collapses degree of the extreme bump contact 55A and the inside bump contact 55B are medium (e.g. the collapsed tip end about 20-35 μm in diameter) and substantially equal to each other.

The inclinations of the bump contacts 55A, 55B with respect to the horizontal plane are small and substantially equal to each other. The degree of the reaction force from the elastic sheet 54 is medium corresponding to the medium collapses degree as above at the extremity thereof and the degree of the reaction force in other portions (including a portion of site adjacent to the bump contact 55B about the central axis of the tip end of the bump contact 55A) are equally smaller (e.g. the collapsed tip end about 5-20 μm in diameter) in comparison with the former as shown FIG. 23.

As apparent from FIGS. 23 and 24, in the electric contact structure 50, the collapse and the inclination of the extreme bump contact 55A are small and approximately equal to those of the adjacent inside bump contact 55B.

The degrees of collapse of both the bump contacts 55A, 55B are approximately equal as apparent from FIG. 24 wherein both the collapsed bump contacts 55A, 55B are laid together.

As described above, in the electric contact structure 50 according to the second embodiment, the collapses and inclinations of the tip ends of both the bump contacts 55A, 55B are substantially the same to each other.

In the inventive electric contact structure, the shape, position or size of the wiring pattern in the placement part of the bump contacts is properly adjusted in accordance with the necessary pressure.

When an area of the front surface wiring beneath the extreme bump contact is smaller than that of the front surface wiring beneath the other bump contact, since the reaction force against the elastic sheet becomes small, it is offset by the increase in the reaction force caused by the extreme position thereof to prolong the life of the bump contact.

The shape, position and size of the arrangement area for the bump contact is adjustable stepwise from the extremity to the inside in accordance with the reaction force applied to the bump contact, and the size of an optional position may be adjusted to reduce the reaction force.

Further, it is unnecessary that the shape of the adjusted wiring pattern resembles the other shape, and the front and rear surface wirings should not be identical in shape.

Figure 25:
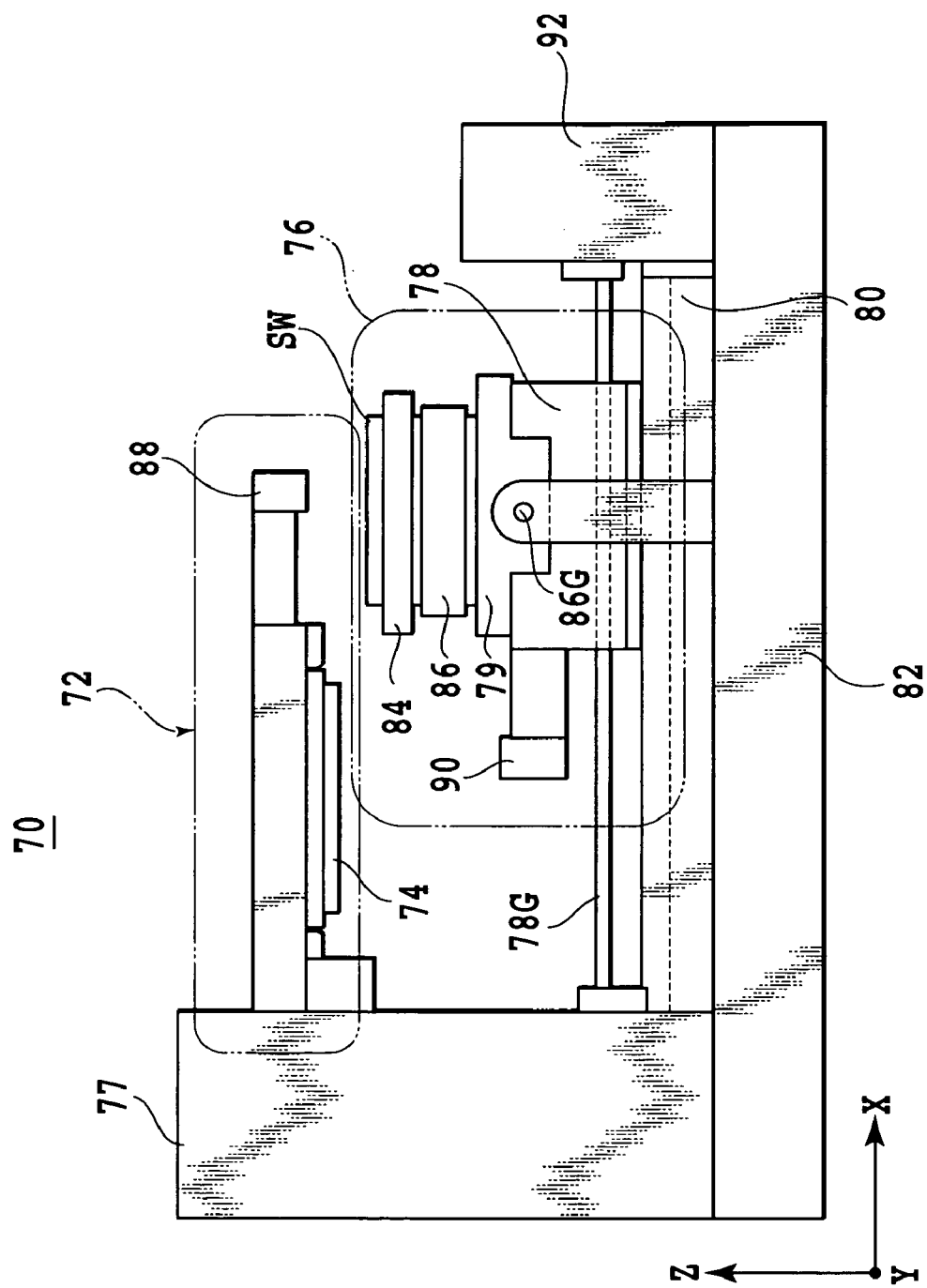
FIG. 25 is a configuration diagram schematically showing an example of a semiconductor device inspection apparatus having an example of a probe card according to the present invention.

FIG. 25 schematically shows a configuration of an example of a semiconductor device inspection apparatus having an example of a probe card according to the present invention.

Referring to FIG. 25, the semiconductor device inspection apparatus primarily comprise a moving table section 76 including a device under test stage (referred to as a DUT stage hereinafter) 84 for supporting a silicon wafer SW as a device under test that is mounted and removed to and from the same, a probe card stage 72 including a probe card 74 for selectively contacting a plurality of wiring patterns formed on the silicon wafer SW to electrically connect each of the wiring patterns to a test unit 142 to be described later, a stage driving mechanism section 77 for moving the probe card stage 72 up and down relative to the DUT stage 84, and a base section 82 for supporting the moving table section 76 and the stage driving mechanism section 77.

A plurality of identical wiring patterns are vertically and horizontally formed throughout the disk-shaped silicon wafer SW, and inspection signals are supplied to the same through the probe card 74.

The moving table section 76 comprises the DUT stage 84 having a mount portion to and from which the silicon wafer SW is mounted and removed, a rotary stage 86 disposed under the DUT stage 84 for rotatably supporting the DUT stage 84, a Y-axis stage 79 for supporting the rotary stage 86 such that it can be moved in a direction vertical to the plane of the drawing or along the direction of a Y-axis in FIG. 25, and an X-axis stage 78 which movably supports the Y-axis stage 79 and which is moved in a direction orthogonal to the Y-axis or in the direction of an X-axis indicated by the arrow X in FIG. 25.

The mount portion of the DUT stage 84 has a mount surface having a plurality of holes which are connected to, for example, a suction side of a suction pump which is omitted in the illustration. As a result, when the silicon wafer SW is placed on the mount surface, the suction pump is activated to hold the silicon wafer SW on the mount surface selectively.

The angle of rotation of the rotary stage 86 disposed at the Y-axis stage 79 is controlled by controlling the driving of a drive motor which is omitted in the illustration.

The Y-axis stage 79 is engaged with a ball screw 86G supported on the X-axis stage 78 to be supported such that it can move along the direction of the Y-axis. One end of the ball screw 86G is linked with an output shaft of a drive motor which is omitted in the illustration. For example, the drive motor is preferably a servo motor, a stepping motor, or a linear motor.

The X-axis stage 78 is slidably supported on a support surface of a support base 80 provided at the base section 82. The X-axis stage 78 is engaged with a ball screw 78G which is linked to an output shaft of a drive motor 92. The drive motor 92 is secured to the base section 82. One end of the ball screw 78G is rotatably supported on an outer shell of the stage driving mechanism section 77. For example, the drive motor 92 is preferably a servo motor, a stepping motor, or a linear motor.

The stage driving mechanism section 77 comprises a ball screw (not shown) engaged with a base end portion of an arm section supporting the probe card stage 72 and a drive motor for rotating the ball screw.

The ball screw is rotatably supported on the outer shell of the stage driving mechanism section 77 on both ends thereof, and is engaged with the arm section supporting the probe card stage 72 orthogonally to the axis of the same. As a result, when the drive motor is activated, the prove card 74 and the base end portion of the arm section are moved up and down according to the rotation of the ball screw. For example, the drive motor is preferably a servo motor, a stepping motor, or a linear motor.

Figure 27A:
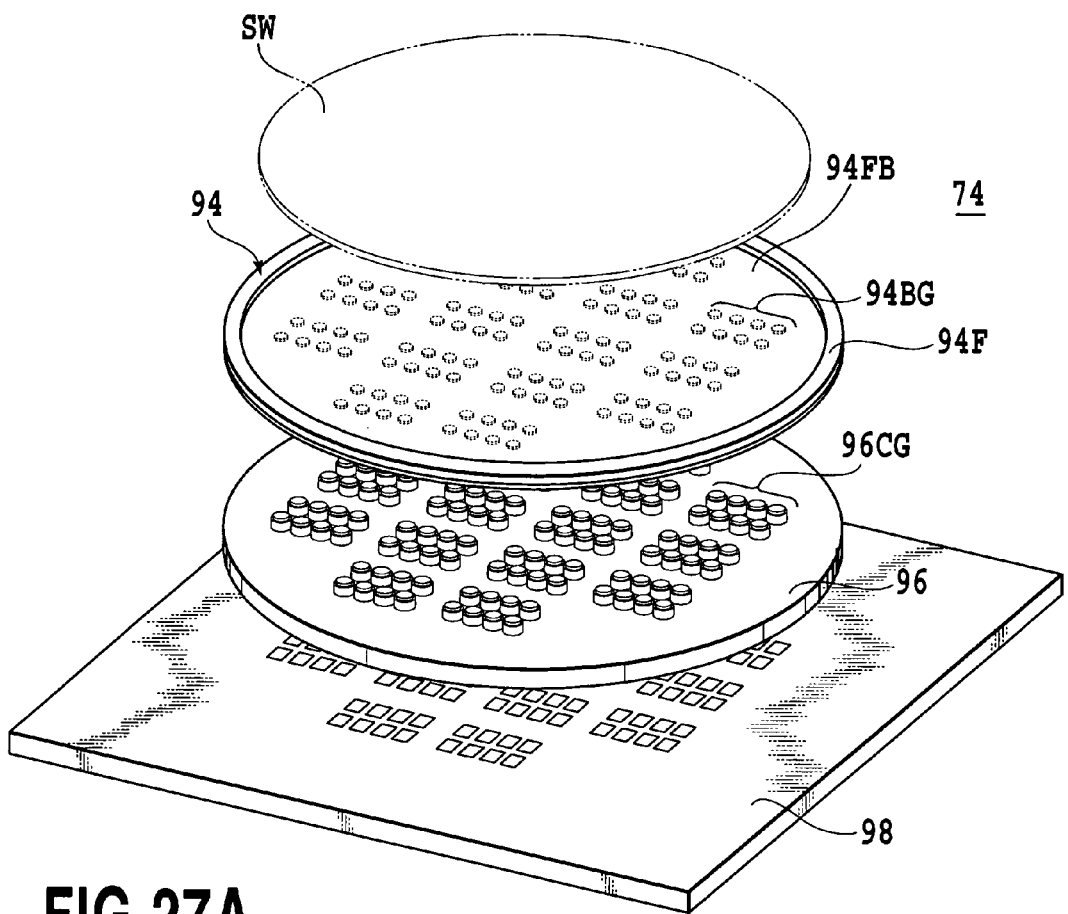
FIG. 27A is a perspective exploded view of an example of a probe card according to the invention that is shown along with a silicon wafer.
Figure 27B:
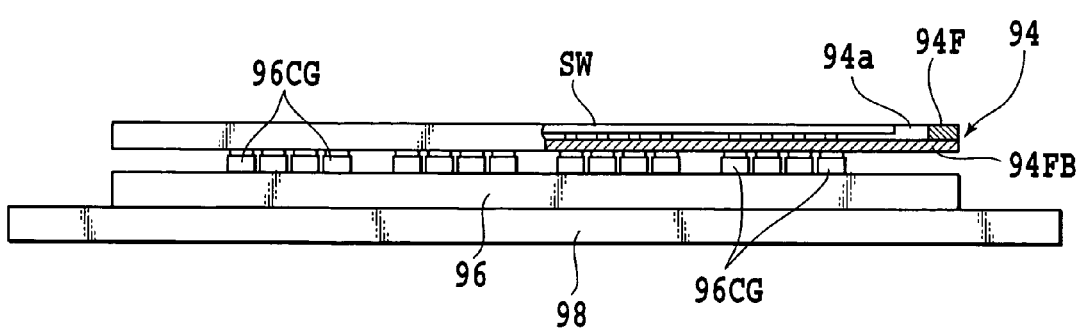
FIG. 27B is a side view of elements constituting the probe card in FIG. 27A in a state in which they are assembled together.

The probe card stage 72 comprises the probe card 74 shown in FIGS. 27A and 27B and the arm section supporting the probe card 74.

As shown in FIGS. 27A and 27B, the probe card 74 comprises a disk-shaped flexible substrate 94 having a plurality of bump groups 94BG electrically connected to each of the wiring patterns on the silicon wafer SW, an anisotropic conductive sheet 96 having a conductive portion directly connected to the bump groups 94BG on the flexible substrate 94, and a wiring substrate 98 having a conductor layer electrically connected to the bump groups 94BG on the flexible substrate 94 through he conductive portion of the anisotropic conductive sheet 96.

The probe card 74 is secured inside a probe card housing provided at the arm section. As shown in FIG. 27B, the flexible substrate 94, the anisotropic conductive sheet 96, and the wiring substrate 98 are secured in the probe card housing in a state in which they are stacked one over another and positioned relative to each other.

Figure 29:
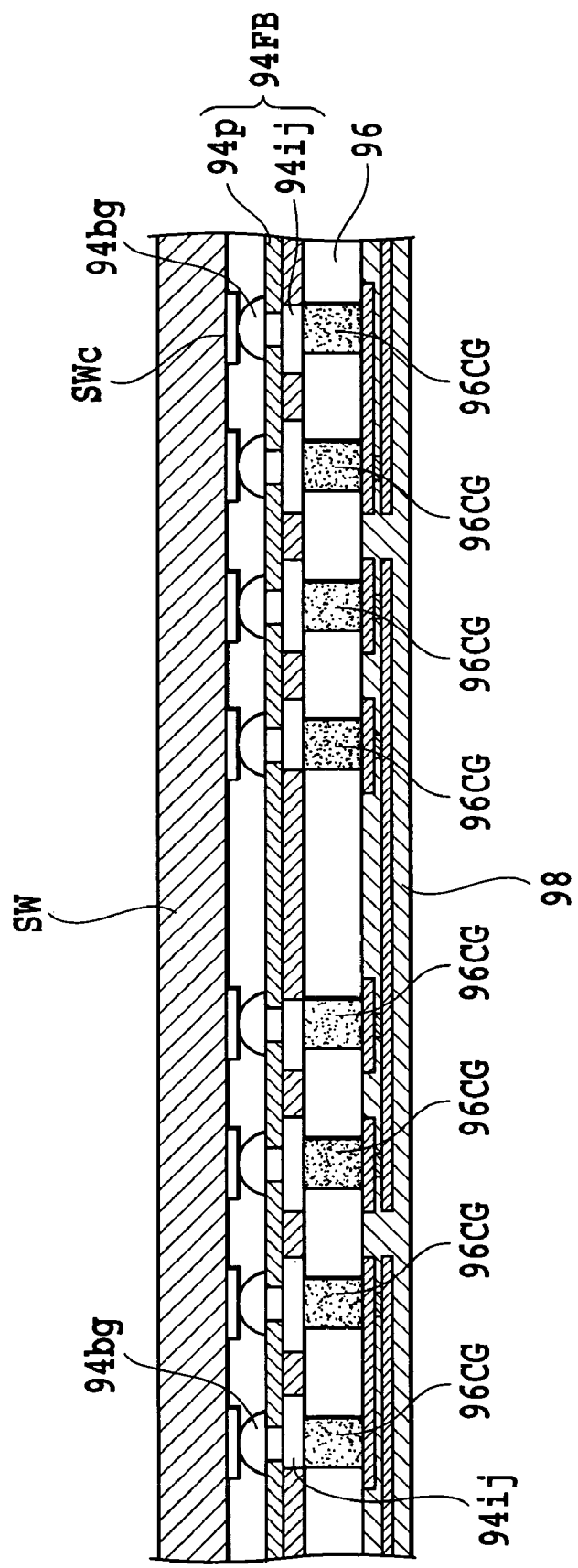
FIG. 29 is an enlarged partial sectional view of a main part of the FIG. 27B.

As shown in an enlarged scale in FIG. 29, the flexible substrate 94 is constituted by a base material portion 94P made of polyimide resin in the form of a thin film, an electrode sheet portion 94FB including the bump group 94BG formed on the base material portion 94P, and an annular frame member 94F made of ceramic and disposed along the periphery of one surface of the base material portion 94P for holding the base material portion 94P with a uniform tensile force. In FIGS. 29 and 27B, bumps 94$bg$ constituting each of the bump groups 94BG are represented by only four bumps among them which are shown in an exaggerated manner in an enlarged scale. In FIG. 27A, eight bumps are shown as a representative in an exaggerated manner.

The frame member 94F is secured on a surface of the base material portion 94P using an adhesive. Thus, a recess is formed inside the frame member 94F to allow the silicon wafer SW to be disposed.

As shown in FIG. 27A, the base material portion 94P has the bump groups 94BG distributed throughout the same and constituted by a plurality of bumps 94$bg$ formed above through holes associated with positions in which the wiring patterns on the silicon wafer SW are detected. A tip end of each of the bumps 94$gb$ protrudes in the form of a hemisphere to a predetermined height above one surface of the base material portion 94P.

Figure 28:
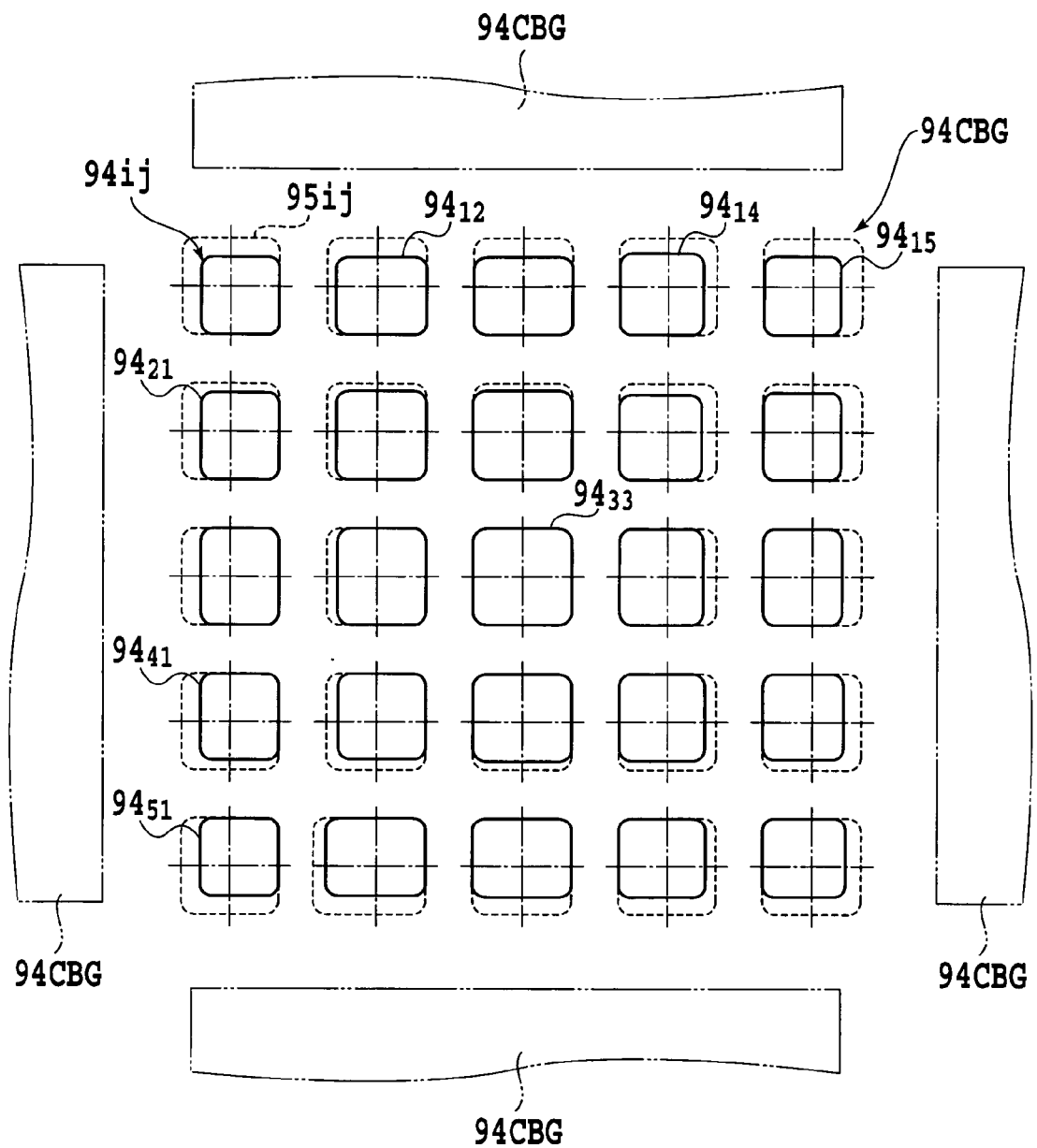
FIG. 28 is a plan view schematically showing a configuration of contact pads on an electrode sheet used in the example of a probe card according to the invention.

On the other surface of the base material portion 94P opposite to the surface on which the bumps are formed, as shown in FIG. 28, contact pad groups 94CBG constituted by contact pads 94$ij$ (i=1 to n and j=1 to n where n represents a positive integer) associated with the bumps 94$bg$ are formed. Each of the contact pads 94$ij$ is electrically connected to a conductive portion 96CG of the anisotropic conductive sheet 96 to be described later.

FIG. 28 shows twenty five uniformly arranged rectangular contact pads 94$ij$ as a representative to simplify the explanation of one contact pad group 94CBG which is surrounded by contact pad groups 94CBG having the same configuration on all sides.

In FIG. 28, a contact pad 94$_{11}$ and a contact pad 94$_{51}$ in a column located in a peripheral part of the surface are substantially identical to each other in shape except for offset direction with respect to contact pad 95$ij$ hereinafter. Contact pads 94$_{21}$ and 94$_{41}$ are substantially identical to each other in shape except for offset direction with respect to a contact pad 95$ij$. In order to make the surface area of the contact pad 94$_{11}$ smaller than the surface area of a contact pad 94$_{33}$ in the middle, the contact pad is formed by cutting off a part of the periphery thereof facing the adjacent contact pad groups 94CBG.

In order to make the surface area of contact pads 94$_{21}$ and 94$_{31}$ smaller than the surface area of the contact pad 94$_{33}$ in the middle, the contact pads are formed by cutting off parts of the periphery thereof facing the adjacent contact pad groups 94CBG.

A contact pad 94$_{12}$ in the column adjacent to the contact pad 94$_{11}$ and a contact pad 94$_{14}$ are substantially identical in shape. A contact pad 94$_{22}$ and a contact pad 94$_{42}$ are substantially identical in shape except for offset direction with respect to contact pad 95$ij$.

The contact pad 94$_{12}$, a contact pad 94$_{32}$, and a contact pad 94$_{52}$ are formed to have a surface area smaller than the surface area of the contact pad 94$_{33}$ in the middle.

The contact pads in the columns in which the contact pads 94$_{14}$ and 94$_{15}$ are provided respectively are identical in shape to the contact pads in the columns in which the contact pads 94$_{12}$ and 94$_{11}$ are provided respectively.

A contact pad 94$_{13}$ and a contact pad 94$_{53}$ are identical to each other in shape, and a contact pad 94$_{23}$ and a contact pad 94$_{43}$ are identical to each other in shape. In order to make the surface area of the contact pad 94$_{13}$ smaller than the surface area of the contact pad 94$_{33}$, the contact pad is formed by cutting off a part of the periphery thereof facing the adjacent contact pad groups 94CBG. The contact pad 94$_{23}$ is formed by cutting off a part of the periphery thereof, to provide it with a surface area intermediate between the surface area of the contact pad 94$_{13}$ and the surface area of the contact pad 94$_{33}$.

The contact pads 94$ij$ are made different from each other in surface area depending on the positions of the contact pads as described above for the reason described blow.

Figure 30:
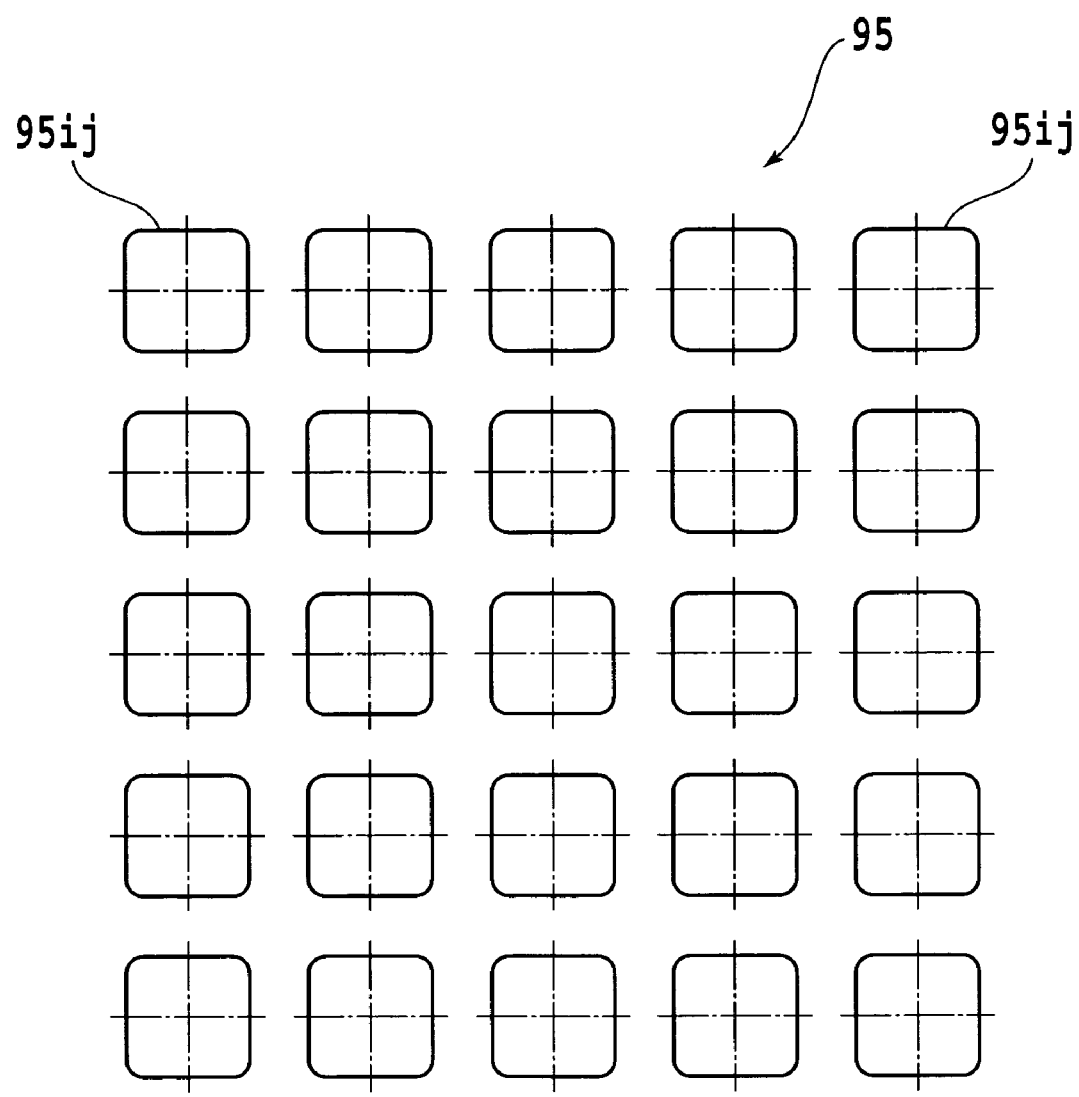
FIG. 30 is a plan view schematically showing a case wherein a plurality of contact pads having the same shape is provided.
Figure 38:
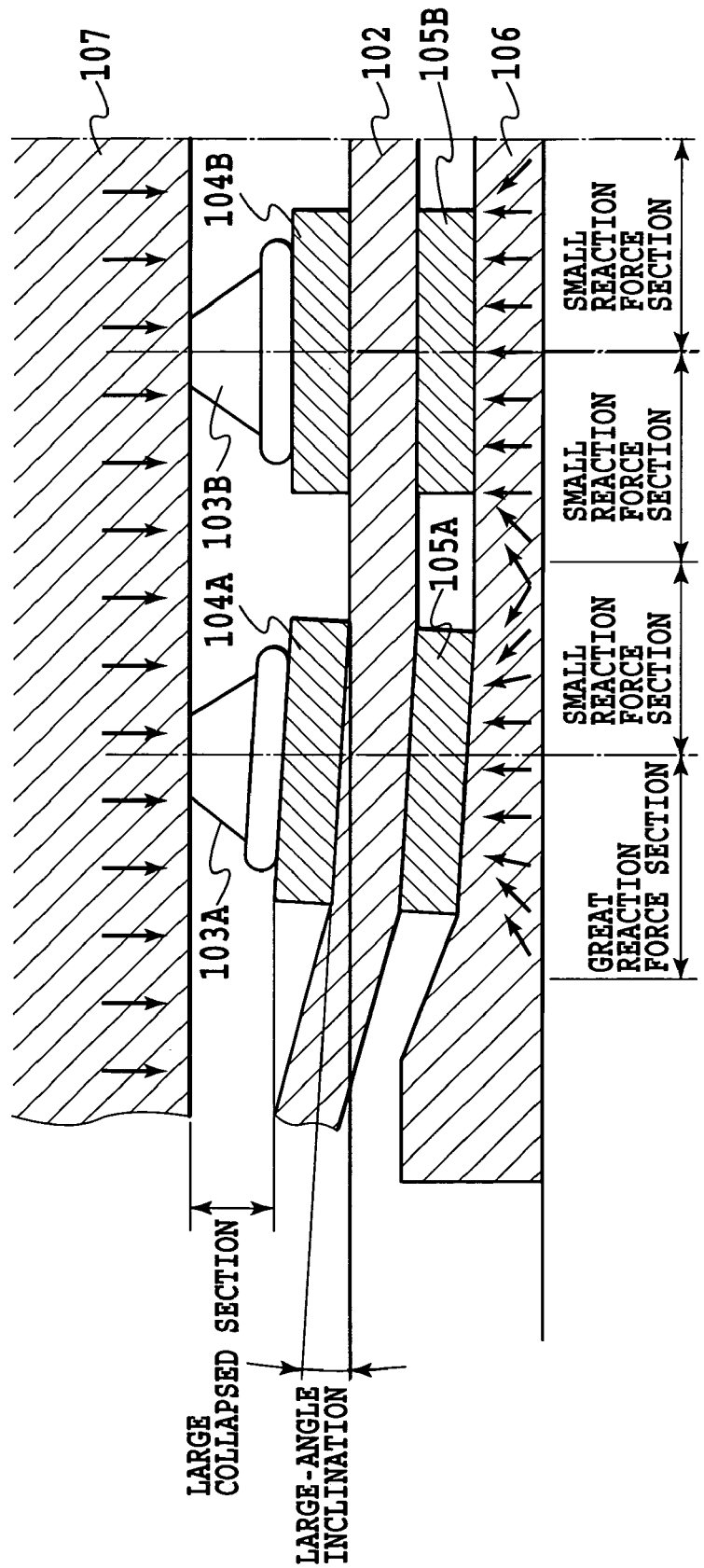
FIG. 38 is an enlarged view of part C in FIG. 37.
Figure 39:
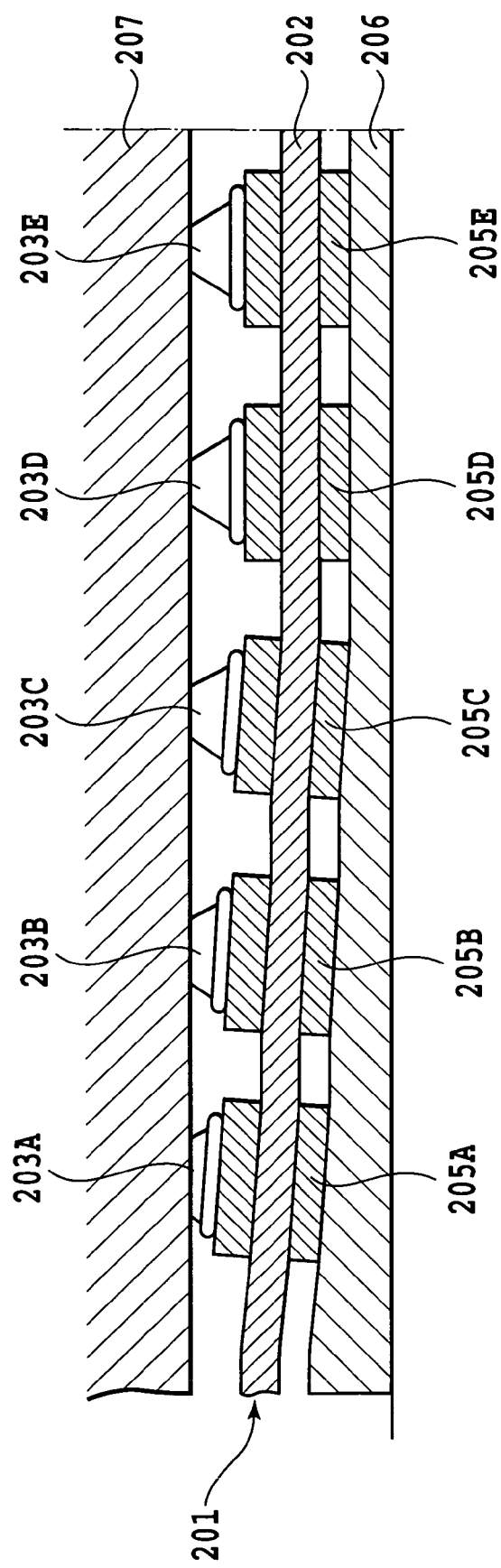
FIG. 39 is a vertical sectional view partially illustrating a contacting state in a second example of the prior art electric contact structure.
Figure 40:
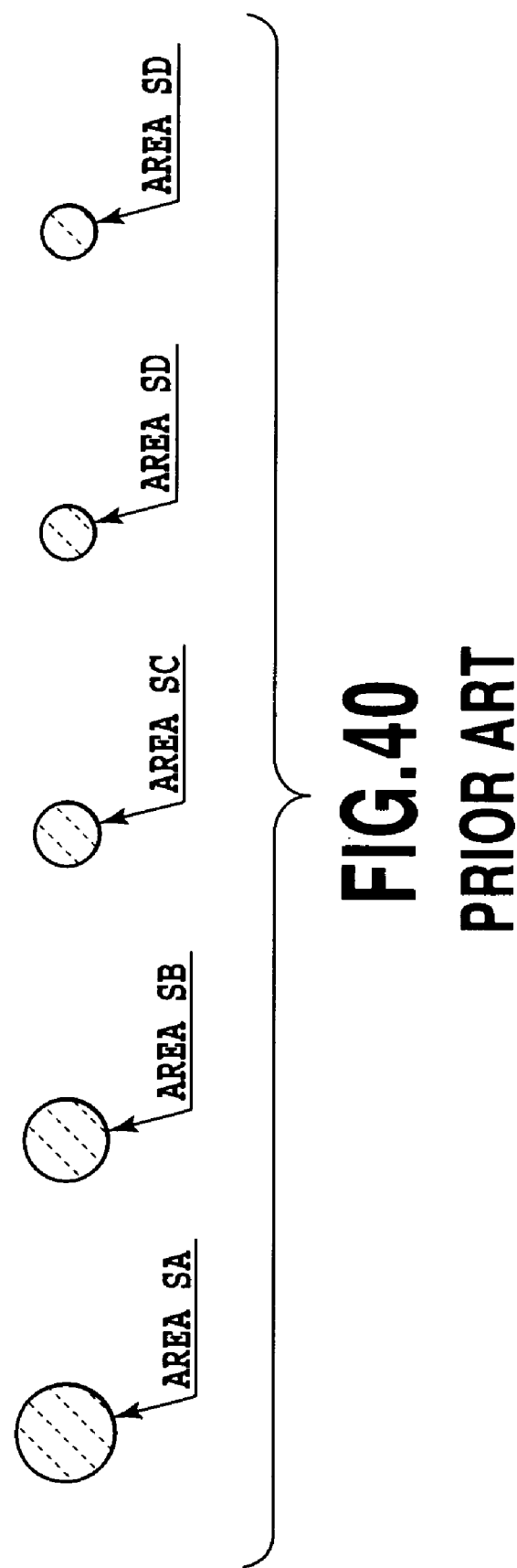
FIG. 40 is a partial plan view illustrating collapsed shapes of tip ends of the bump contacts in the prior art electric contact structure in FIG. 39.

For example, let us assume that the contact pad groups 94CBG are constituted by square contact pads 95$ij$ (i=1 to n and j=1 to n where n is a positive integer) identical to each other in surface area and uniformly arranged in two directions as shown in FIG. 30. Then, as described above with reference to FIGS. 39 and 40, the tip ends of bumps associated with rows of contact pads 95$_{11}$ to 95$_{15}$, 95$_{51}$ to 95$_{55}$, 95$_{11}$ to 95$_{51}$, and 95$_{11}$ to 95$_{55}$ located near the periphery of each contact pad group 94CBG may receive a resilient force (a reactive force) from the anisotropic conductive sheet 96 when pressed. The tip ends may be thereby pressed against electrodes SWc on the silicon wafer SW by a component of force acting in a direction oblique to the surface of the base material portion as shown in FIG. 38. Thus, the tip ends of the bumps 94$bg$ located near the periphery of each bump group 94BG may be collapsed to a degree higher than the degree of collapse at the tip ends of other bumps.

Under the circumstance, as described above, each of the contact pad 94$_{11}$ and so on located at the periphery is formed by cutting off a part of the periphery thereof facing the adjacent contact pad group(s) 94CBG so that its surface area becomes smaller than the surface area of the contact pad 94$_{33}$ in the middle which will not be pressed in an oblique direction.

Since the contact pads are formed by cutting off a part of the periphery facing the adjacent contact pad groups 94CBG, the force in a direction oblique to the surface of the base material portion generated by the resilient force (reactive force) of the anisotropic conductive sheet will have a smaller effect on the contact pad groups 94CBG. Thus, the bumps 94$bg$ and the contact pads 94$ij$ will not be inclined beyond a predetermined angle.

It is therefore possible to prevent the tip ends of the bumps 94$bg$ located near the periphery of each bump group 94BG from being collapsed beyond the degree of collapse of the tip ends of other bumps.

Figure 32:
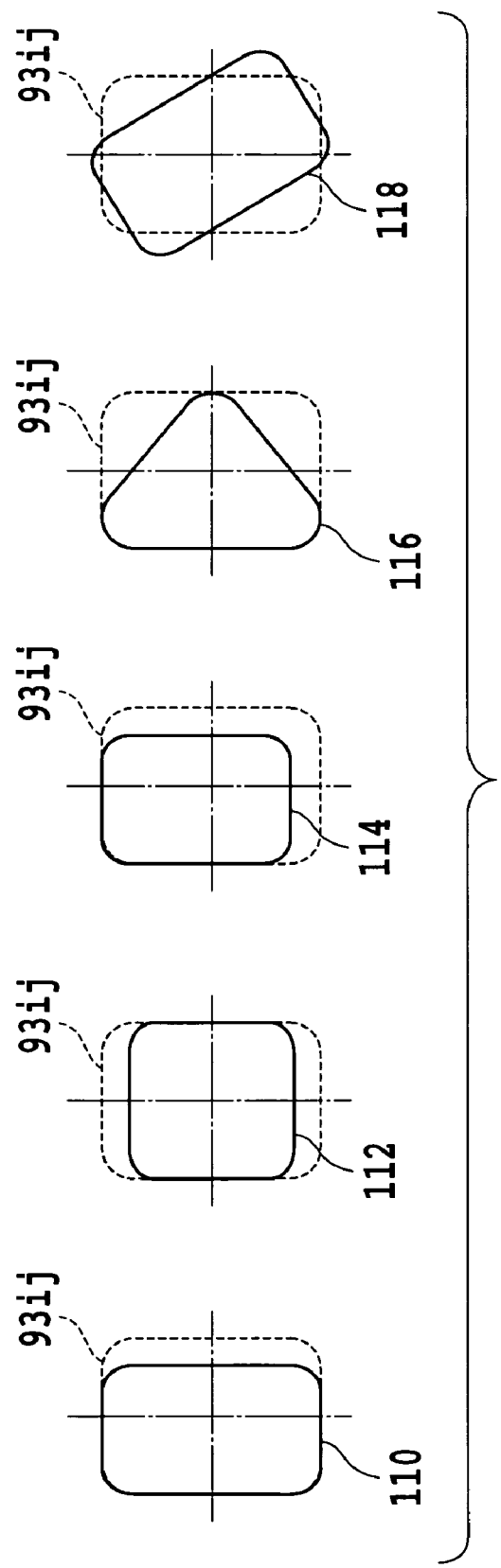
FIG. 32 shows another example of the configuration of the contact pads on the electrode sheet used in the example of a probe card according to the invention.

Although the central contact pad $94_{33}$ in FIG. 28 is a substantially square contact pad, the invention is not limited to such an example, and a contact pad $93ij$ in the middle may have, for example, a substantially rectangular shape as shown in FIG. 32.

When such a shape is employed, contact pads 110, 112, and 114 associated with bumps 94bg located near the periphery of each bump group 94BG may be formed in rectangular shapes obtained by partially cutting the shape of the contact pad $93_{ij}$ in predetermined amounts on one longer side, on both shorter sides, and in a range extending along longer and shorter sides to include at least one corner, respectively, as shown in FIG. 32. A contact pad 116 associated with bumps 94bg located at the periphery of each bump group 94BG may be formed in a spindle shape by cutting off each of triangular parts near two corners of the shape of the contact pad $93_{ij}$ as shown in FIG. 32. Further, each contact pad 118 associated with bumps 94bg located near the periphery of each bump group 94BG may have a shape that is similar to the shape of the contact pad $93_{ij}$ and inclined at a predetermined angle from the same.

Figure 33A:
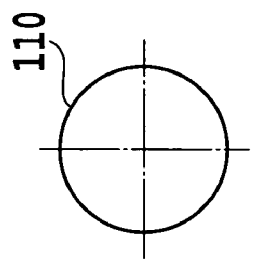
FIG. 33A shows still another example of the configuration of the contact pads on the electrode sheet used in the example of a probe card according to the invention.

Furthermore, a contact pad 111 in the middle may have a circular shape as shown in FIG. 33A.

Figure 33B:
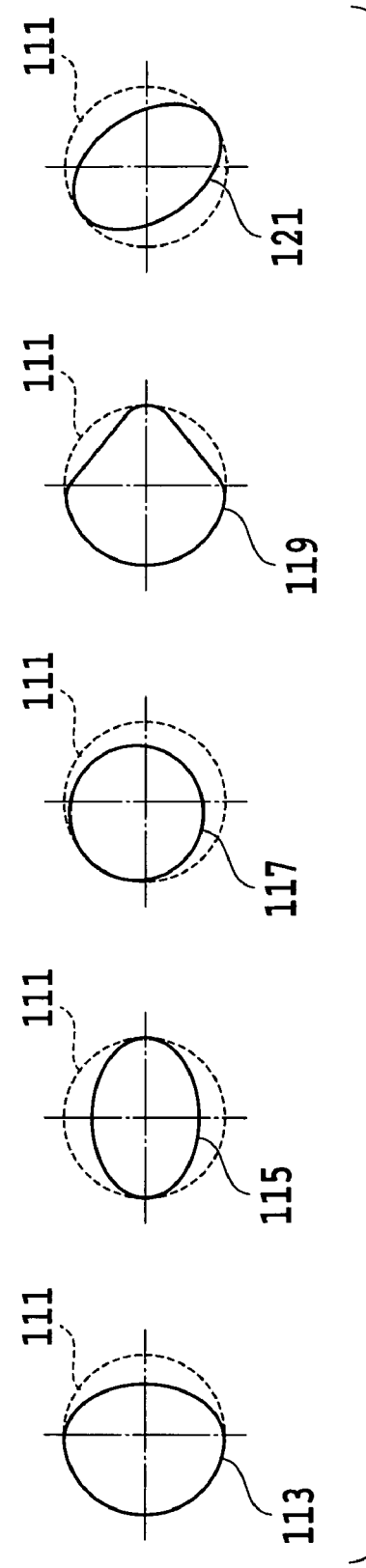
FIG. 33B shows another example of the configuration of the contact pads on the electrode sheet used in the example of a probe card according to the invention.
Figure 34:
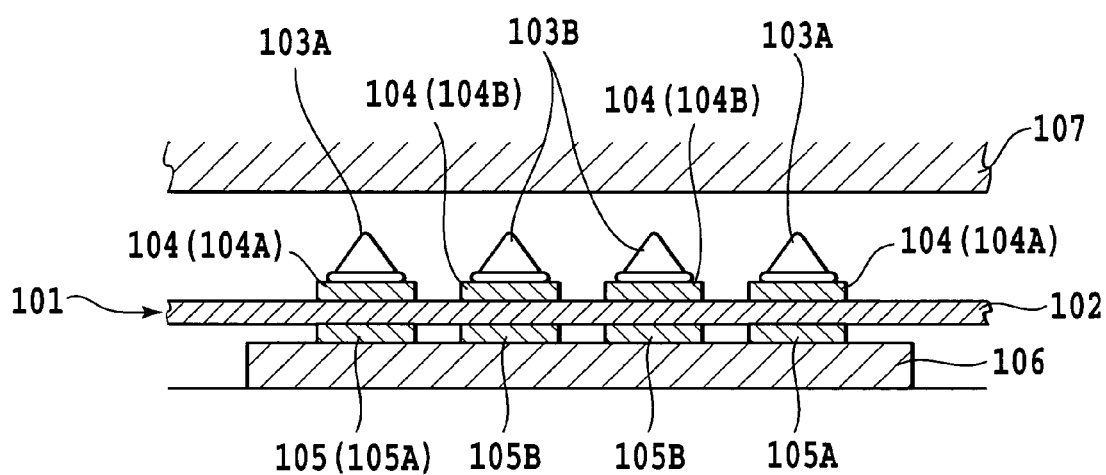
FIG. 34 is a vertical sectional view partially illustrating an initial state of a first example of the prior art electric contact structure.
Figure 35:
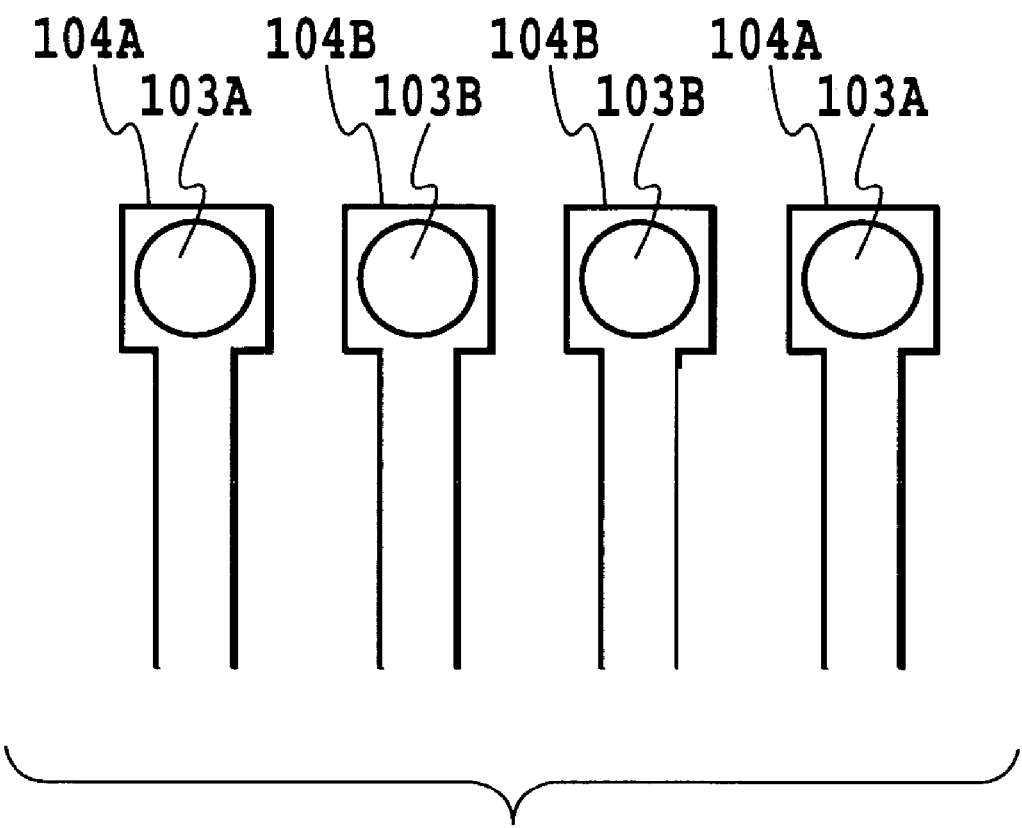
FIG. 35 is a partial plan view of a front surface wiring pattern in the first example of the prior art electric contact structure shown in FIG. 34.
Figure 36:
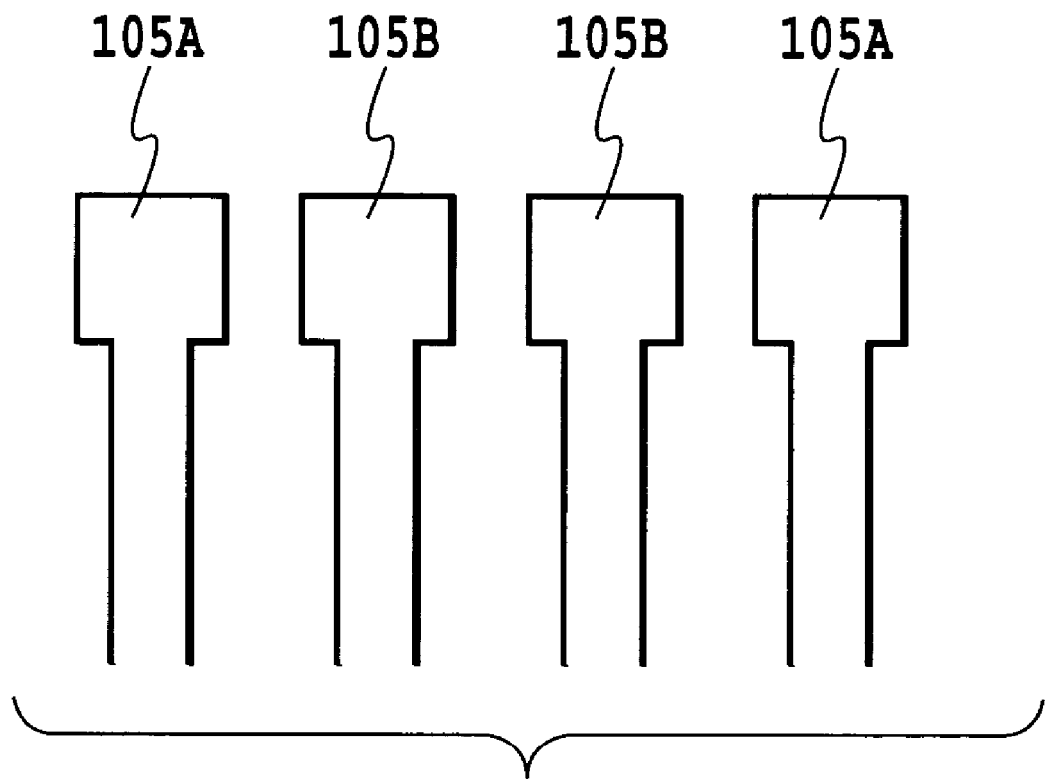
FIG. 36 is a partial plan view of a rear surface wiring pattern in the first example of the prior art electric contact structure shown in FIG. 34.
Figure 37:
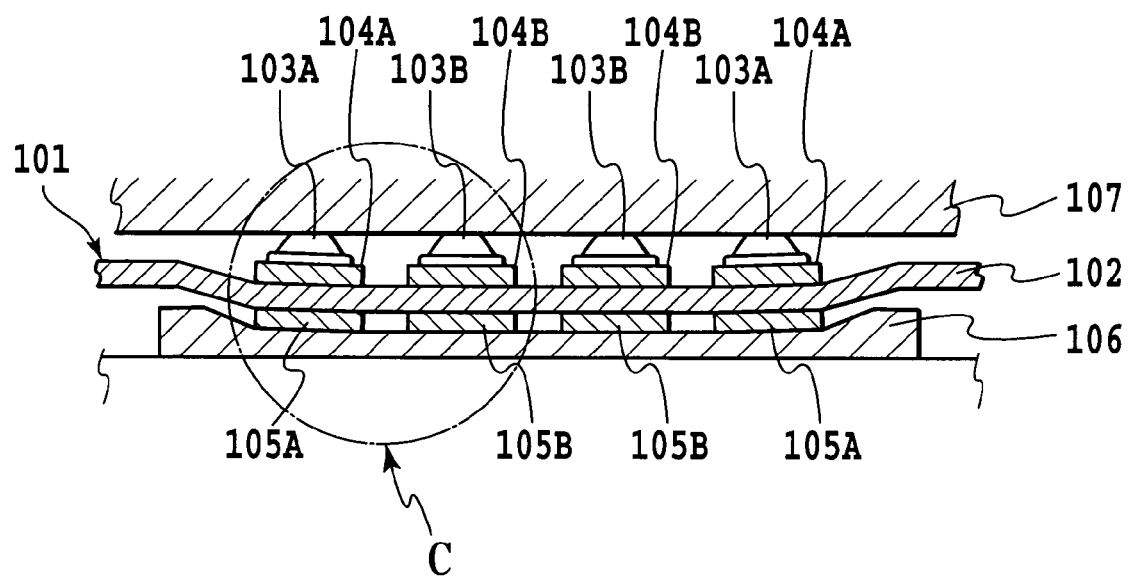
FIG. 37 is a vertical sectional view partially illustrating a contacting state in the first example of the prior art electric contact structure shown in FIG. 34.

When such a shape is employed, as shown in FIG. 33B, each of the contact pads 110, 112, and 114 associated with the bumps 94bg located near the periphery of each bump group 94BG may have elliptic shapes that are formed by cutting off parts of the contact pad 111. As shown in FIG. 33B, a contact pad 119 associated with the bumps 94bg located near the periphery of each bump group 94BG may have a shape that is formed by cutting off bow-shaped parts in two locations of the contact pad 111. Further, a contact pad 121 associated with the bumps 94bg located near the periphery of each bump group 94BG may have an elliptic shape that is formed by cutting off parts of the contact pad 111 and inclined at a predetermined angle from the same.

Although the example shown in FIG. 28 represents one contact pad group 94CGB surrounded by contact pad groups 94CBG having the same configuration on all sides thereof, such a configuration is not essential. For example, as shown in FIG. 31, two contact pod groups 94'CBG and 94"CBG, which adjoin a contact pad group 94CBG located in the middle of them in a face-to-face relationship, may be different from each other in shape.

Figure 31:
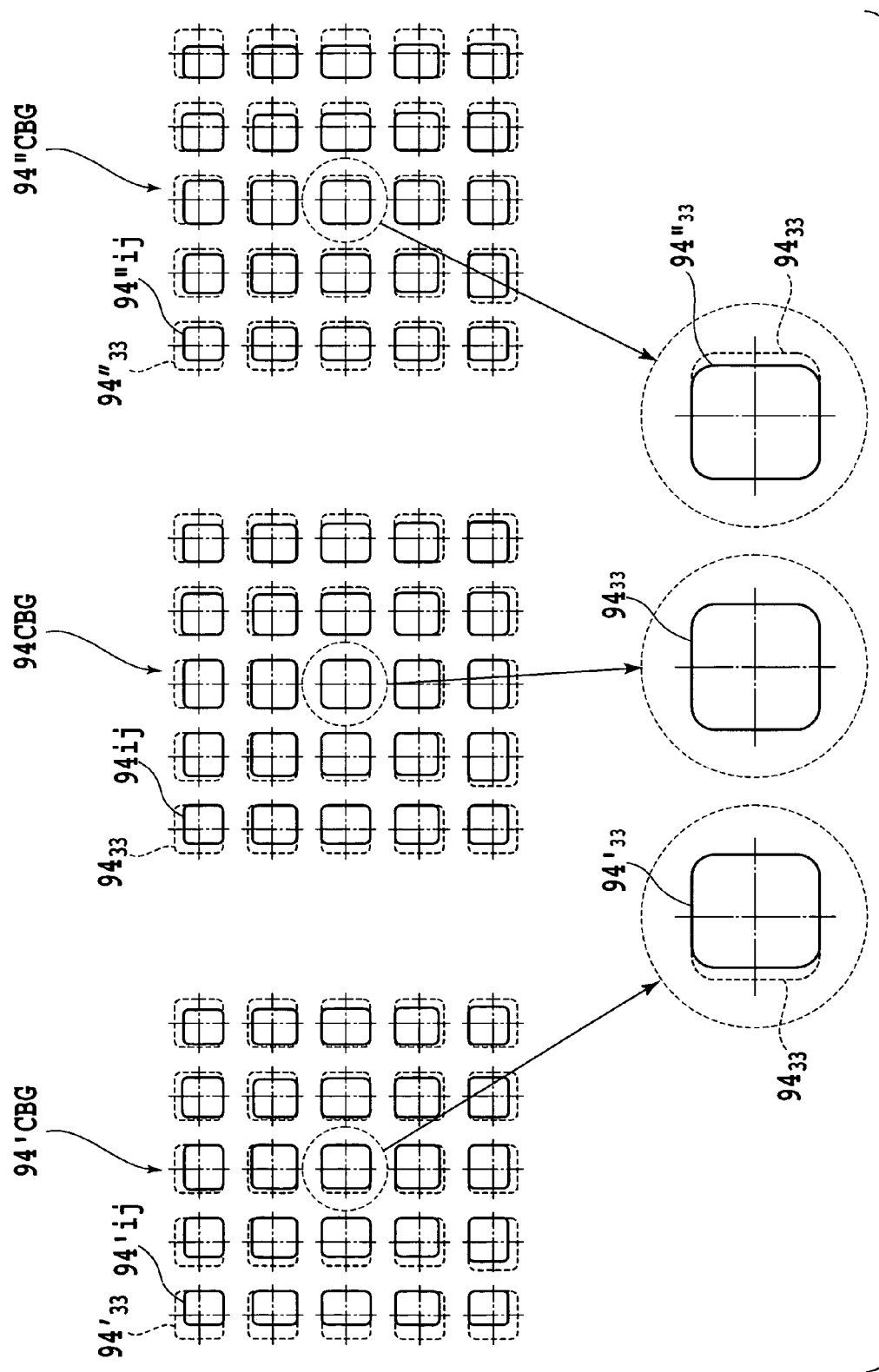
FIG. 31 is a plan view showing a modification of the group of contact pads on the electrode sheet used in the example of a probe card according to the invention.

The configuration of the contact pad group 94CBG located in the middle in FIG. 31 is the same as that shown in FIG. 28 described above.

A contact pad $94'_{33}$ in the middle of the contact pad group 94'CBG has a rectangular shape which is partially cut on the left side thereof when compared to a contact pad $94_{33}$ in the middle of the contact pad group 94CBG. Referring to the shape of other contact pads $94'ij$ associated with bumps 94bg located near the periphery of each bump group 94BG, they have shapes formed by cutting off parts of the contact pad $94'_{33}$ such that their surface areas will be smaller than the surface area of the contact pad $94'_{33}$.

A contact pad $94''_{33}$ in the middle of the contact pad group 94"CBG has a rectangular shape which is partially cut on the right side thereof when compared to a contact pad $94_{33}$ in the middle of the contact pad group 94CBG. Referring to the shape of other contact pads $94''ij$ associated with bumps 94bg located near the periphery of each bump group 94BG, they have shapes formed by cutting off parts of the contact pad $94''_{33}$ such that their surface areas will be smaller than the surface area of the contact pad $94''_{33}$.

Figure 26:
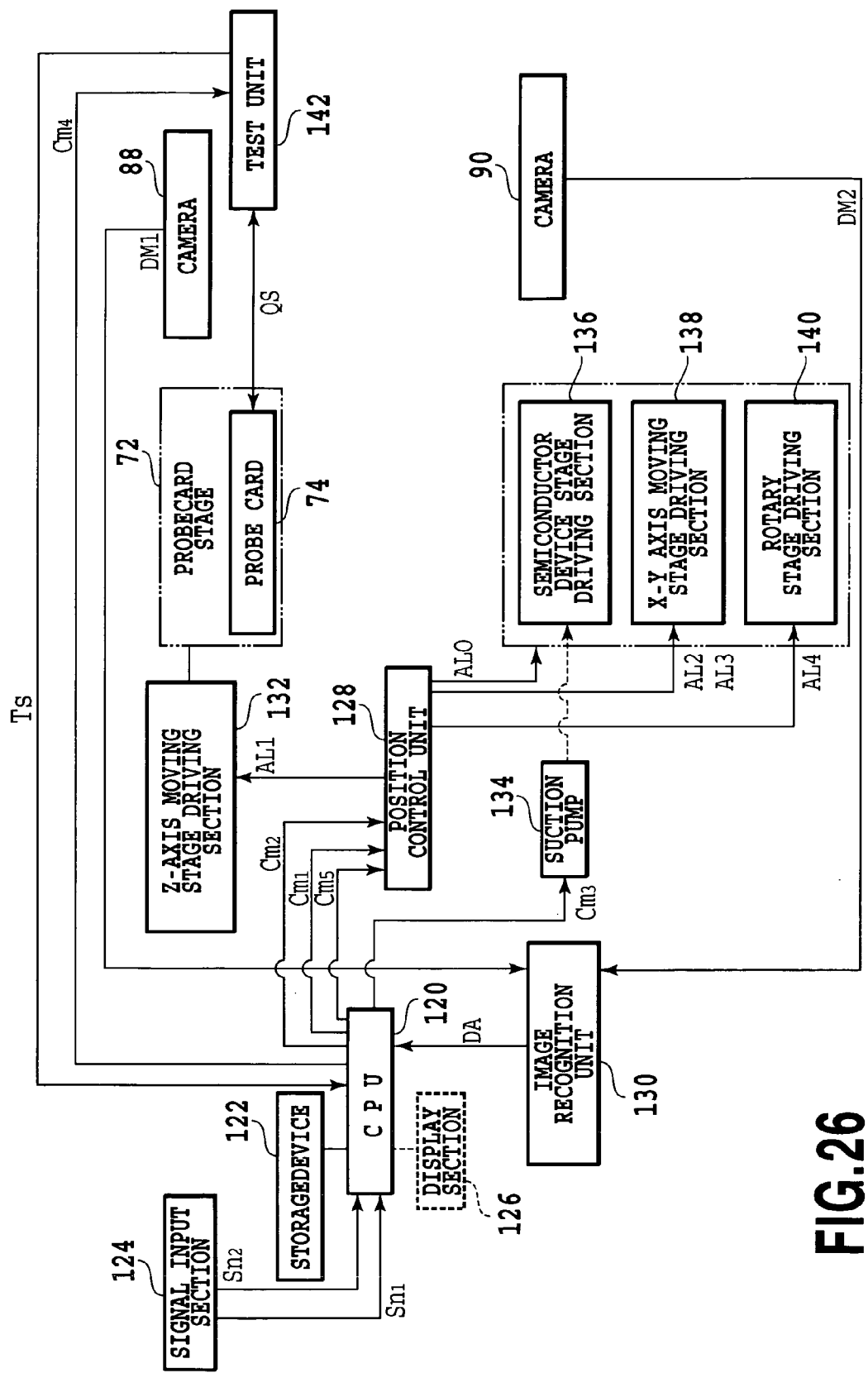
FIG. 26 is a block diagram showing a configuration of a control block provided in the semiconductor device inspection apparatus shown in FIG. 25.

As shown in FIG. 26, the semiconductor device inspection apparatus having an embodiment of a probe card according to the invention further includes a control block for controlling operations of the probe card stage 72 and the moving table section 76.

Referring to FIG. 26, the control block has a central processing unit (CPU) 120.

The CPU 120 is supplied with data Ts indicating a test result from a test unit 142 which supplies a group of inspection signals QS to the probe card 74 to determine whether a silicon wafer SW is good or not, a mounting complete signal Sn1 from a signal input section 124 indicating that the mounting of the silicon wafer SW on the DUT stage 84 has been completed, and a test start signal Sn2. The CPU 120 is also supplied with data DA from an image recognition unit 130 to be described layer indicating the relative positional relationship of the probe card 74 to the silicon wafer SW.

A storage device 122 is connected to the CPU 120. Stored in the storage device 122 are data and signals sequentially supplied to the CPU 120, initial position data to serve as a reference for the probe card stage 72 (probe card 74), and data representing home positions of the DUT stage 84 and the X-axis stage 78. Further, data representing programs for controlling operations of the probe card stage 72 and the moving table section 76 to be described later are also stored.

Further, a display section 126 such as a liquid crystal display or CRT is connected to the CPU 120. For example, the display section 126 displays whether the tested silicon wafer WS is good or not based on a display signal indicating the test result from the test unit 142 supplied by the CPU 120.

The image recognition unit 130 is supplied with photographic data DM1 representing an image and coordinate data of the silicon wafer SW from a camera 88 for wafer alignment provided at the probe card stage 72 and photographic data DM2 representing an image and coordinate data of the bumps 94bg on the probe card 74 from a camera 90 for probe alignment provided at the X-axis stage 78.

The image recognition unit 130 performs predetermined image processing based on the photographic data DM1 and DM2, calculates any positional offset between the bumps 94bg on the probe card 74 and predetermined detecting positions in the wiring pattern on the silicon wafer SW to generate data DA representing the positional offset, and transmits the data to the CPU 120.

Based on the data DA from the image recognition unit 130, the initial position data to serve as a reference for the probe card stage 72 (probe card 74) stored in the storage device 122, and the data representing the home positions of the DUT stage 84, the X-axis stage 78, and the rotary stage 86, the CPU 120 calculates amounts of movement required for adjusting the positions of the Y-axis stage 79, the X-axis stage 78, and the rotary stage 86 to achieve accurate alignment between the bumps 94bg on the probe card 74 and the predetermined detecting positions in the wiring pattern on the silicon wafer SW. The CPU 120 generates control signals Cm1, Cm2, and Cm5 representing the calculated amounts of movement for the X-axis stage 78, Y-axis stage 79, and the rotary stage 86, respectively, and supplies them to a position control unit 128.

The position control unit 128 generates drive control signals AL2, AL3, and AL4 based on the control signals Cm1, Cm2, and Cm5 and supplies them to an X-Y axis moving stage driving section 138 and a rotary stage driving section 140 which comprise the above-described drive motors. As a result, the positions of the X-axis stage 78, the Y-axis stage 79, and the rotary stage 86 are adjusted in the directions of the X-axis and Y-axis shown in FIG. 25 to achieve accurate alignment between the bumps 94bg on the probe card 74 and the predetermined detecting positions in the wiring pattern on the silicon wafer SW.

The position control unit 128 supplies the control signal AL1 to a Z-axis moving stage driving section 132 to move the bum contacts 94a on the probe card 74 downward a preset moving distance to put them into contact with the predetermined detecting positions in the wiring pattern on the silicon wafer SW. Thus, the bumps 94b on the probe card 74 are put in contact with the predetermined detecting positions in the wiring pattern on the silicon wafer SW.

In such a configuration, the CPU 120 supplies the control signals Cm1, Cm2, and Cm5 to the position control unit 128 to position the X-axis stage 78, the Y-axis stage 79, and the rotary stage 86 in their home positions based on the test start signal Sn2. Thus, the position control unit 128 generates a drive signal ALO based on the control signals Cm1, Cm2, and Cm5 and supplies it to the X-Y axis moving stage driving section 138 and the rotary stage driving section 140. After the X-axis stage 78, the Y-axis stage 79, and the rotary stage 86 are positioned in their home positions, the CPU 120 generates a control signal Cm3 and supplies it to the suction pump 134 to activate the suction pump 134 which is connected to the DUT stage mounting section 136 based on the mounting complete signal Sn1 from the signal input section 124. Therefore, the silicon wafer SW is held in the DUT stage mounting section 136.

Next, based on the data DA from the image recognition unit 130 representing the relative positional relationship (positional offset) of the probe card 74 to the silicon wafer SW, the CPU 120 calculates the amounts of movement required for adjusting the positions of the X-axis stage 79, the X-axis stage 78, and the rotary stage 86, generates the control signals Cm1, Cm2, and Cm5, and supplies them to the position control unit 128. Thus, the position control unit 128 generates the drive control signals AL2, AL3, and AL4 based on the control signals Cm1, Cm2, and Cm5 and supplies them to the X-Y axis moving stage driving section 138 and the rotary stage driving section 140. The position control unit 128 supplies a control signal AL1 to the Z-axis moving stage driving section 132 driving the above-described stage driving mechanism section 77 to move the bumps 94b on the prove card 74 downward the preset moving distance to put them in contact with the predetermined detecting positions in the wiring pattern on the silicon wafer SW. Thus, the bumps 94b on the probe card 74 are put in contact with the predetermined detecting positions in the wiring pattern on the silicon wafer SW.

Subsequently, the CPU 120 supplies a request signal Cm4 representing the completion of preparation of the test and a request for starting of the test to the test unit 142. The test unit 142 starts supplying the group of inspection signals QS to the prove card 74 to determine whether the silicon wafer SW is good or not.

Then, based on the data Ts representing the test result from the test unit 142, the CPU 120 generates the display signal representing the result and supplies it to the display section 126. Thus, the display section 126 displays whether the testes silicon wafer SW is good or not.

The inventive electric contact structure may be applicable to an electric contact in various testers for electronic parts, handler test sockets, burn-in test sockets, measurement appliances.

The present invention has been described in detail with respect to the preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A semiconductor device connector comprising:
an electrode sheet disposed on a surface of an insulation substrate and having a bump contact to be in contact with an electrode section of a semiconductor device and a bump contact placement wiring connected to said bump contact;
a sheet member disposed beneath said electrode sheet, said sheet member being elastically deformed when pressed through said electrode sheet; and
a signal input/output section electrically connected to the electrode section of said semiconductor device through said electrode sheet, wherein
a width of said bump contact placement wiring corresponding a bump contact to be in contact with an extreme electrode section of said semiconductor device is smaller than a width of a bump contact placement wiring formed in association with a bump contact adjacent to said bump contact.

2. A semiconductor device carrier comprising;
a carrier housing having a housing portion for accommodating a semiconductor device;
an electrode sheet disposed in said carrier housing, having a front surface wiring conductively wired on a front surface of an insulation substrate, a rear surface wiring conductively wired on a rear surface of said insulation substrate, a rear surface bump contact placement wiring formed on said rear surface wiring, and a bump contact disposed in a contact placement portion on said front surface wiring to be in contact with an electrode section of said semiconductor device;
a pressing member held by said carrier housing, for pressing said semiconductor device housed therein onto said electrode sheet; and
an elastic sheet disposed in said carrier housing to be in contact with the bottom of said electrode sheet; wherein
a width of said rear surface bump contact placement wiring in correspondence to a bump contact to be in contact with an extreme electrode section of said semiconductor device is smaller than a width of said front surface bump contact placement wiring on which a bump contact to be in contact with the extreme electrode section is arranged.

3. A semiconductor device carrier as claimed in claim 2, wherein a width of said rear surface bump contact placement wiring in correspondence to said bump contact to be in contact with the extreme electrode section of said semiconductor device is smaller than a width of a rear surface bump contact placement wiring formed on said rear surface wiring of the adjacent bump contact.

4. A semiconductor device carrier as claimed in claim 3, wherein a width of said rear surface bump contact placement wiring formed on said rear surface wiring of said bump contact to be in contact with said electrode section of said semiconductor device becomes smaller as it is closer from a center of said electrode section of said semiconductor device to an extremity of said electrode section of said semiconductor device.

5. A semiconductor device carrier comprising:
a carrier housing having a housing portion for accommodating a semiconductor device;
an electrode sheet disposed in said carrier housing, having a front surface wiring conductively wired on an insulation substrate, and a bump contact disposed on said front surface wiring to be in contact with an electrode section of said semiconductor device;

a pressing member held by said carrier housing, for pressing said semiconductor device housed therein onto said electrode sheet; and an elastic sheet disposed in said carrier housing to be in contact with the bottom of said electrode sheet; wherein a width of a contact placement portion on which said bump contact to be in contact with the extreme electrode section of said semiconductor device is smaller than a width of a contact placement portion arranged in the adjacent bump contact.

6. A semiconductor device carrier as claimed in claim 5, wherein a width of said contact placement portion becomes smaller as it is closer from the center of said electrode section in said semiconductor device to the extremity of said electrode section in said semiconductor device.

7. A semiconductor device socket comprising:

a semiconductor device carrier defined in any one of claims 2 to 6, a socket body having a carrier housing for accommodating said semiconductor device carrier, and a contact terminal disposed in said socket body to be in contact with a pad provided in an electrode sheet.

8. A probe card comprising:

an electrode sheet disposed on a surface of an insulation substrate and having a plurality of groups of bump contacts constituted by a set of bump contacts to be in contact with an electrode section of a wiring pattern on a semiconductor device and a rear surface bump contact placement wiring formed on said rear surface of said insulation substrate, said rear surface bump contact placement wiring connected to said bump contacts;

an anisotropic conductive sheet disposed to be in contact with the surface of said electrode sheet on which the rear surface bump contact placement wiring is formed, the sheet being put in a conductive state when pressed through said electrode sheet; and a wiring board electrically connected to the electrode section of said semiconductor device through said electrode sheet and said anisotropic conductive sheet, wherein a width of said rear surface bump contact placement wiring in correspondence to a bump contact to be in contact with an extreme electrode section of said semiconductor device is smaller than a width of a rear surface bump placement wiring formed in association with a bump contact adjacent to said bump contact.

9. A semiconductor device connector as claimed in claim 1, wherein said bump contact placement wiring includes a contact placement portion formed on a surface of an insulation substrate and having a bump contact and a rear surface bump contact placement wiring formed on a rear surface of said insulation substrate, said rear surface bump contact placement wiring connected to said bump contacts, and a width of said rear surface bump contact placement wiring in correspondence to a bump contact to be in contact with an extreme electrode section of said semiconductor device is smaller than a width of said contact placement portion on which a bump contact to be in contact with the extreme electrode section is arranged.

10. A semiconductor device connector as claimed in claim 1, wherein a width of said bump contact placement wiring becomes smaller as it is closer from the center of said electrode section in said semiconductor device to the extremity of said electrode section in said semiconductor device.

* * * * *